United States Patent
Kinoshita et al.

(10) Patent No.: US 10,957,722 B2
(45) Date of Patent: Mar. 23, 2021

(54) METHOD OF MANUFACTURING FLEXIBLE DEVICE USING MULTIDIRECTIONAL OBLIQUE IRRADIATION OF AN INTERFACE BETWEEN A SUPPORT SUBSTRATE AND A FLEXIBLE SUBSTRATE

(71) Applicant: JOLED INC., Tokyo (JP)

(72) Inventors: Tomoatsu Kinoshita, Tokyo (JP);
Takashige Fujimori, Tokyo (JP);
Yuichi Kato, Tokyo (JP)

(73) Assignee: JOLED INC., Tokyo (JP)

( * ) Notice: Subject to any disclaimer, the term of this patent is extended or adjusted under 35 U.S.C. 154(b) by 68 days.

(21) Appl. No.: 15/603,406

(22) Filed: May 23, 2017

(65) Prior Publication Data
US 2017/0345849 A1 Nov. 30, 2017

(30) Foreign Application Priority Data

May 26, 2016 (JP) .............................. JP2016-105262
Nov. 29, 2016 (JP) .............................. JP2016-231491

(51) Int. Cl.
*H01L 27/12* (2006.01)
*H01L 27/32* (2006.01)
(Continued)

(52) U.S. Cl.
CPC ...... *H01L 27/1262* (2013.01); *B23K 26/0604* (2013.01); *B23K 26/0676* (2013.01);
(Continued)

(58) Field of Classification Search
CPC ......... H01L 21/76251; H01L 21/76254; H01L 27/3244; H01L 51/0097; H01L 2227/323;
(Continued)

(56) References Cited

U.S. PATENT DOCUMENTS 4,560,249 A * 12/1985 Nishiwaki ................ G02B 5/32
359/3
8,876,998 B2 * 11/2014 Park .................... H01L 51/0097
156/247
(Continued)

FOREIGN PATENT DOCUMENTS

JP       10-125930 A       5/1998
JP    2006-349599 A      12/2006
(Continued)

OTHER PUBLICATIONS

Office Action in JP Application No. 2016-231491, dated Oct. 29, 2019. 2pp.

*Primary Examiner* — Ermias T Woldegeorgis
(74) *Attorney, Agent, or Firm* — Hauptman Ham, LLP

(57) ABSTRACT

A method of manufacturing a flexible device includes joining a first surface of a support substrate to a back surface of a flexible substrate, the first surface being opposite to a second surface of the support substrate; forming an element layer on a front surface of the flexible substrate; and performing multidirectional oblique irradiation of an interface and its vicinity between the support substrate and the flexible substrate with laser light from the second surface of the support substrate to detach the support substrate from the flexible substrate.

16 Claims, 22 Drawing Sheets

(51) Int. Cl.
   *H01L 51/00* (2006.01)
   *B23K 26/067* (2006.01)
   *B23K 26/53* (2014.01)
   *B23K 26/06* (2014.01)
   *B23K 26/12* (2014.01)
   *B23K 26/082* (2014.01)
   *B23K 103/00* (2006.01)
   *B23K 103/16* (2006.01)
   *B23K 101/40* (2006.01)

(52) U.S. Cl.
   CPC .......... *B23K 26/082* (2015.10); *B23K 26/127* (2013.01); *B23K 26/1224* (2015.10); *B23K 26/53* (2015.10); *H01L 27/3244* (2013.01); *H01L 51/0097* (2013.01); *B23K 2101/40* (2018.08); *B23K 2103/172* (2018.08); *B23K 2103/54* (2018.08); *B23K 2103/56* (2018.08); *H01L 2227/323* (2013.01); *H01L 2251/5338* (2013.01)

(58) Field of Classification Search
   CPC ........ H01L 2251/5338; H01L 27/1262; B23K 26/02; B23K 26/067; B23K 26/0676; B23K 2103/54; B23K 2103/172; B23K 2101/40; B23K 2103/56; B23K 26/53; B23K 26/0604; B23K 26/127; B23K 26/082; B23K 26/1224; Y02E 10/549
   See application file for complete search history.

(56) References Cited

U.S. PATENT DOCUMENTS

| | | | |
|---|---|---|---|
| 2006/0292887 A1* | 12/2006 | Hara | H01L 21/78 438/753 |
| 2007/0010067 A1* | 1/2007 | Shimoda | G02F 1/13454 438/455 |
| 2008/0261379 A1* | 10/2008 | Jinbo | H01L 21/76254 438/458 |
| 2009/0170286 A1 | 7/2009 | Tsukamoto et al. | |
| 2018/0108874 A1* | 4/2018 | Tanaka | B23K 26/064 |

FOREIGN PATENT DOCUMENTS

| | | |
|---|---|---|
| JP | 2009-177154 A | 8/2009 |
| WO | 2016/143316 A1 | 9/2016 |

* cited by examiner

METHOD OF MANUFACTURING FLEXIBLE DEVICE USING MULTIDIRECTIONAL OBLIQUE IRRADIATION OF AN INTERFACE BETWEEN A SUPPORT SUBSTRATE AND A FLEXIBLE SUBSTRATE

CROSS REFERENCE TO RELATED APPLICATIONS

This application claims the benefit of Japanese Priority Patent Applications JP2016-105262 filed May 26, 2016 and JP2016-231491 filed Nov. 29, 2016, the entire contents of both of which are incorporated herein by reference.

BACKGROUND

The disclosure relates to a method of manufacturing a flexible device having a flexible substrate and an apparatus for manufacturing such a flexible device.

Various flexible devices have been proposed, in which different element layers are formed on a flexible substrate such as a plastic substrate or a resin substrate. One example of such flexible devices is disclosed in Japanese Unexamined Patent Application Publication No. H10-125930.

SUMMARY

In general, flexible devices as described above are requested for an improvement in their production yield rates. It is desirable to provide a method of manufacturing a flexible device at an improved yield rate and an apparatus for manufacturing such a flexible device.

A method of manufacturing a flexible device according to a first embodiment of the disclosure includes: joining a first surface of a support substrate to a back surface of a flexible substrate, the first surface being opposite to a second surface of the support substrate; forming an element layer on a front surface of the flexible substrate; and performing multidirectional oblique irradiation of an interface and its vicinity between the support substrate and the flexible substrate with laser light from the second surface of the support substrate to detach the support substrate from the flexible substrate.

An apparatus for manufacturing a flexible device according to an embodiment of the disclosure includes an element forming section, and one or more of a plurality of laser light sources. An element forming section forms an element layer on a front surface of a flexible substrate. The flexible substrate has a back surface joined to a first surface of a support substrate. The first surface is opposite to a second surface of the support substrate. One or more of a plurality of laser light sources irradiate an interface and its vicinity between the support substrate and the flexible substrate with laser light from the second surface of the support substrate. Multidirectional oblique irradiation of the interface and its vicinity with the laser light causes the support substrate to be detached from the flexible substrate.

A method of manufacturing a flexible device according to a second embodiment of the disclosure includes: joining a back surface of a flexible substrate to a first surface of a support substrate; forming an element layer on a front surface of the flexible substrate; bringing a second surface of the support substrate into contact with a flowable member, the second surface being opposite to the first surface; and performing irradiation with laser light from the second surface of the support substrate to detach the support substrate from the flexible substrate.

A method of manufacturing a flexible device according to a third embodiment of the disclosure includes: joining a back surface of a flexible substrate to a first surface of a support substrate; forming an element layer on a front surface of the flexible substrate; subjecting a second surface of the support substrate to a surface treatment, the second surface being opposite to the first surface; and performing irradiation with laser light from the second surface of the support substrate to detach the support substrate from the flexible substrate.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

In the following, some example embodiments of the disclosure are described in detail, in the following order, with reference to the accompanying drawings.

1. First embodiment (an example of a manufacturing method in which multidirectional oblique irradiation with laser light is performed in detaching a support substrate from a display unit)
2. Application Example 1 (an example of application to a manufacturing apparatus)
3. Second embodiment (an example of a manufacturing method in which a second surface of a support substrate is brought into contact with a liquid)
4. Modification Example 1 (an example in which a second surface of a support substrate is brought into contact with a liquid stored in a dam)
5. Modification Example 2 (an example in which a second surface of a support substrate is brought into contact with a high-viscosity material)
6. Modification Example 3 (an example in which a high-viscosity material is cured after being brought into contact with a second surface of a support substrate)
7. Third embodiment (an example of a manufacturing method in which a second surface of a support substrate is subjected to a surface treatment)
8. Application Example 2 (an example of application to an electronic apparatus includes a flexible device)

1. First Embodiment

[Configuration]

Figure 1:
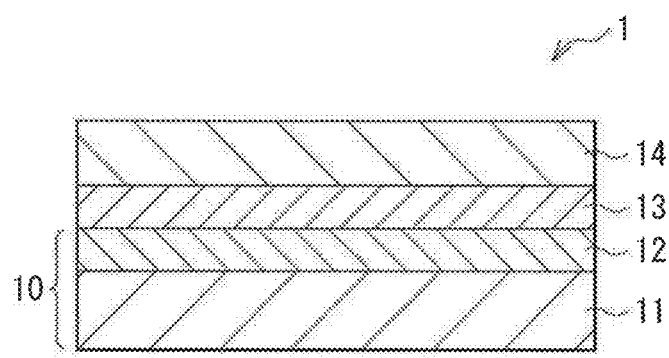
FIG. 1 is a schematic cross-sectional view of an example of an overall configuration of a display unit, as a flexible device, according to a first embodiment of the disclosure.

FIG. 1 schematically and cross-sectionally illustrates an example of an overall configuration of a display unit, as a flexible device, according to one embodiment of the disclosure. The display unit is referred to below as a display unit 1. The display unit 1 may be an organic electro-luminescence (EL) device, for example, and has a configuration in which a display element layer 13 and a protection layer 14 are provided on a semiconductor unit 10 in this order. The semiconductor unit 10 may include a flexible substrate 11 and a thin film transistor (TFT) layer 12 provided on a front surface of the flexible substrate 11, for example. The combination of the TFT layer 12 and the display element layer 13 may correspond to an "element layer" in one specific but non-limiting embodiment of the disclosure.

The flexible substrate 11 may be made of a resin material, and examples of the resin material may include polyethylene terephthalate (PET), polyimide (PI), polycarbonate (PC), polyethylene naphthalate (PEN), polyamide (PA), and polyethersulfone (PES). In short, the flexible substrate 11 may be a resin or plastic substrate, for example. However, the constituent material for the flexible substrate 11 is not limited to any of these resin materials. Alternatively, the flexible substrate 11 may be made of any other material.

The TFT layer 12 may be a layer that includes thin-film transistors and other elements. Each of the thin-film transistors may be a top-gate, bottom-gate, or dual-gate thin-film transistor, for example, and may include a semiconductor layer in a selective region of the flexible substrate 11. This semiconductor layer may include a channel region or active layer and may be made of an oxide semiconductor that contains, as a major component, an oxide of one or more of elements, including indium (In), gallium (Ga), zinc (Zn), tin (Sn), titanium (Ti), and niobium (Nb), for example. Specific examples of the oxide semiconductor may include indium-tin-zinc oxide (ITZO), indium-gallium-zinc oxide (IGZO: InGaZnO), zinc oxide (ZnO), indium-zinc oxide (IZO), indium-gallium oxide (IGO), indium-tin oxide (ITO), and indium oxide (InO). Alternatively, the semiconductor layer may be made of low-temperature polysilicon (LTPS) or amorphous silicon (a-Si), for example.

The display element layer 13 may include a plurality of pixels and display elements or light-emitting elements to be driven by a backplane to perform display. The backplane may be provided with a plurality of thin-film transistors therein. Each of the display elements may be an organic EL element or a liquid crystal element, for example. When the display element is an organic EL element, for example, the organic EL element may include an anode electrode, an organic electroluminescent layer, and a cathode electrode, for example, which are provided from the TFT layer 12 in this order. The anode electrode may serve as a first electrode, the organic electroluminescent layer may serve as a display function layer, and the cathode electrode may serve as a second electrode. The anode electrodes may be coupled to the source-drain electrodes of the above thin-film transistors. A cathode potential common to the pixels may be applied to the cathode electrodes through a wire, for example.

The protection layer 14 may be a layer that protects the display element layer 13 from the outside. The protection layer 14 may be made of an inorganic material, and examples of the inorganic material may include silicon oxide ($SiO_x$), silicon nitride ($SiN_x$), and silicon oxynitride (SiON). Alternatively, the protection layer 14 may be made of an organic material.

Figure 2A:
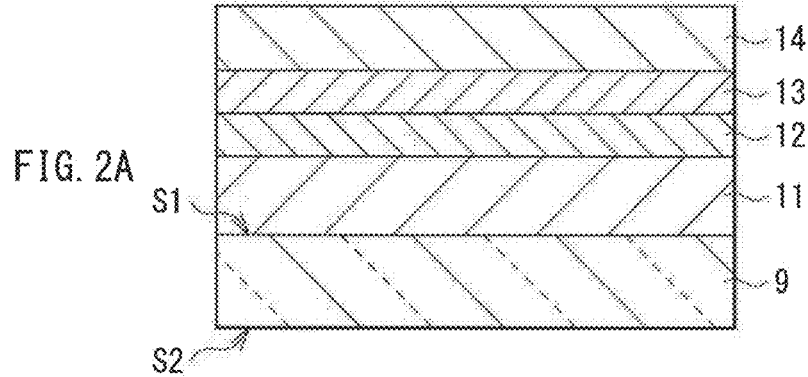
FIG. 2A is an explanatory schematic cross-sectional view of a support substrate that is used during the manufacture of the display unit illustrated in FIG. 1.

To manufacture the display unit 1 configured as described above, the flexible substrate 11 may be joined in advance to a support substrate 9, which may be a glass substrate or other suitable substrate, for example, as illustrated in detail in FIG. 2A. More specifically, the support substrate 9 may have a front surface S1 and a back surface S2 that are opposite to each other. Herein, the front surface S1 may serve as a first surface, and a back surface S2 may serve as a second surface. The front surface S1 of the support substrate 9 may be joined to the back surface of the flexible substrate 11. Examples of the glass material for the support substrate 9 may include a quartz glass, a soda glass, and an alkali-free glass.

Figure 2B:
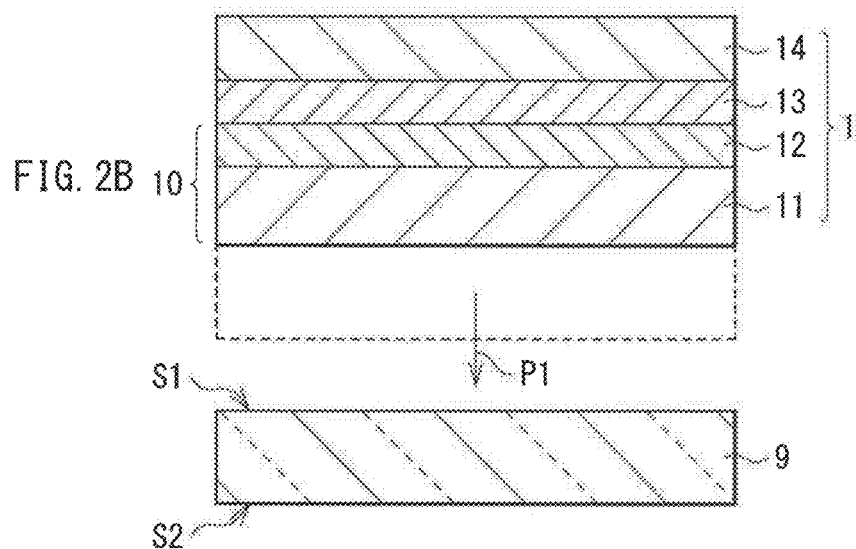
FIG. 2B is a schematic cross-sectional view of a step subsequent to the step illustrated in FIG. 2A.

After formation, on the flexible substrate 11, of the individual layers, which may include the TFT layer 12, the display element layer 13, and the protection layer 14, the support substrate 9 may be detached from the flexible substrate 11, for example, as indicated by an arrow P1 of FIG. 2B. More specifically, in this embodiment, an interface and its vicinity between the support substrate 9 and the flexible substrate 11 is irradiated with laser light so that the support substrate 9 is detached from the flexible substrate 11, as described later in detail.

[Manufacturing Method]

The display unit 1 as described above may be manufactured through the following processing.

First, the front surface S1 of the support substrate 9 described above may be joined to the back surface of the flexible substrate 11. Examples of this joining method may include: a method in which a varnish or similar liquid is applied to the support substrate 9 and then baked; and a method in which the support substrate 9 is joined to the flexible substrate 11 with an adhesive layer, for example. A constituent material for the adhesive layer may be siloxane, for example.

After the joining of the support substrate 9 to the flexible substrate 11 in the above manner, the element layer, which may include the TFT layer 12 and the display element layer 13, may be formed on the front surface of the flexible substrate 11.

More specifically, the semiconductor layer made of one of the above materials, such as an oxide semiconductor, may be formed on the flexible substrate 11 with a sputtering or other film forming process. Thereafter, the semiconductor layer may be patterned into a predetermined shape with pattern forming processes such as photolithography and etching. Following which, various dielectric films and electrodes may be formed thereon to fabricate the TFT layer 12.

Subsequently, the display element layer 13 may be formed on the TFT layer 12. When the display element layer 13 contains an organic EL element, for example, the display element layer 13 including anode electrodes, organic electroluminescent layers, and cathode electrodes may be formed on the TFT layer 12.

Following the above, the protection layer 14 made of one of the above materials may be formed on the display element layer 13 with a chemical vapor deposition (CVD) or other film forming process.

Thereafter, the support substrate 9 may be detached from the flexible substrate 11, for example, as indicated by the arrow P1 in FIG. 2B. More specifically, an interface and its vicinity, such as the adhesive layer, between the support substrate 9 and the flexible substrate 11 may be irradiated with laser light from the back surface S2 of the support substrate 9, as described later in detail. In this way, the support substrate 9 is detached from the flexible substrate 11. One exemplary mechanism by which the emission of the laser light cause the support substrate 9 to be detached from the flexible substrate 11 is as follows. The emission of the laser light weaken or lose the cohesive strength between atoms or molecules that form the flexible substrate 11, or the cohesive strength between atoms or molecules in a substance that forms the above adhesive layer. This results in occurrence of intra-layer detachment or interface detachment.

Through the above processing, the display unit 1 illustrated in FIG. 1 is completed.

[Workings and Effects]
[Basic Operation]

The display unit 1 may drive the pixels in the display element layer 13 on the basis of an image signal received from the outside, thereby displaying an image. In this case, for example, the thin-film transistors in the TFT layer 12 may be individually voltage-driven in relation to the respective pixels. More specifically, when a voltage that is equal to or greater than a threshold voltage is supplied to any thin-film transistor, the above semiconductor layer may be activated. In other words, channels may be formed in the semiconductor layer. As a result, currents may flow between pairs of the source-drain electrodes in the thin-film transistors. By voltage-driving the thin-film transistors in this manner, the display unit 1 may display an image.

COMPARATIVE EXAMPLE

FIGS. 3 to 6 illustrate schematically and cross-sectionally a method of manufacturing the display unit 1 according to a comparative example. The method of manufacturing the display unit 1 according to the comparative example may be substantially the same as the foregoing method according to the embodiment. Specifically, individual layers that include a TFT layer 12, a display element layer 13, and a protection layer 14 may be formed on a flexible substrate 11. Thereafter, laser light irradiation may be utilized so that a support substrate 9 is detached from the flexible substrate 11.

Figure 3:
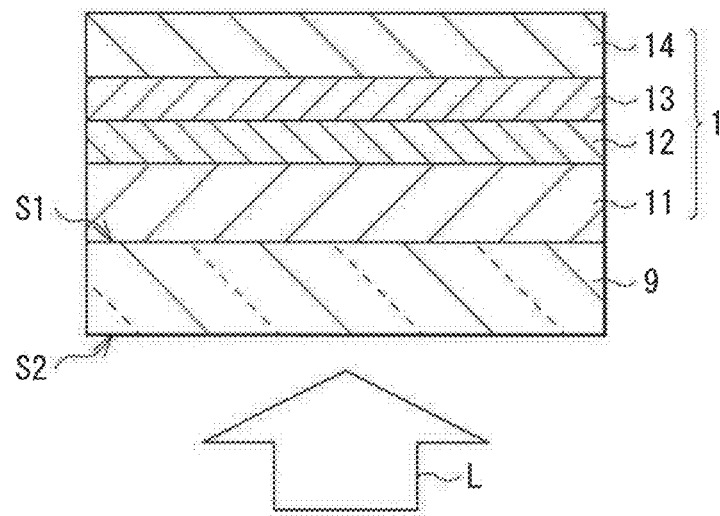
FIG. 3 is a schematic cross-sectional view of an example of an overall configuration of a display unit, as a flexible device, according to a comparative example.
Figure 4:
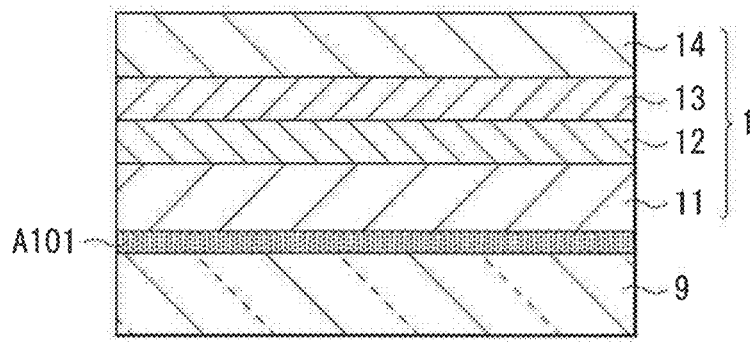
FIG. 4 is a schematic cross-sectional view of an example of a laser-light-irradiated region illustrated in FIG. 3.

More specifically, an interface and its vicinity between the support substrate 9 and the flexible substrate 11 may be irradiated with laser light L in the vertical direction from a back surface S2 of the support substrate 9, for example, as illustrated in FIG. 3. As a result, the support substrate 9 may be detached from the flexible substrate 11 throughout a region A101 irradiated with the laser light L, for example, as illustrated in FIG. 4. In this example, the irradiated region A101 may correspond to the entire region of the interface between the support substrate 9 and the flexible substrate 11.

Figure 5:
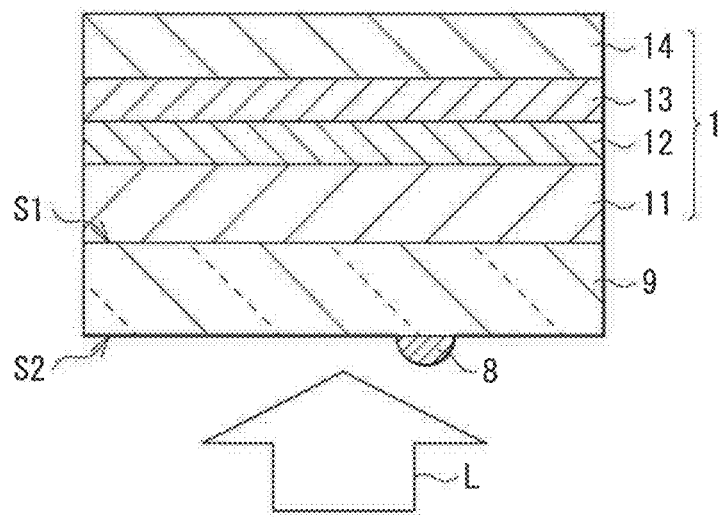
FIG. 5 is a schematic cross-sectional view of an example of an overall configuration in which a foreign object is present on a support substrate illustrated in FIG. 3.

When a foreign object 8 is present on the support substrate 9, especially on the back surface S2 of the support substrate 9, for example, as illustrated in FIG. 5, the following disadvantage may arise in the display unit 1 according to the comparative example when the support substrate 9 is detached from the flexible substrate 11 using the laser light L. It is to be noted that, when a flaw is present on the back surface S2 of the support substrate 9 instead of the foreign object 8, a similar disadvantage may arise.

Figure 6:
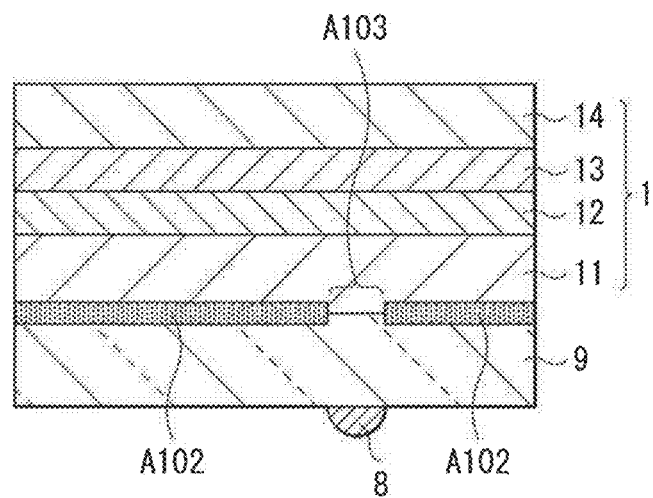
FIG. 6 is a schematic cross-sectional view of an example of a laser-light-irradiated region and a laser-light-unirradiated region illustrated in FIG. 5.

In this case, a region A102 irradiated with the laser light L and a region A103 unirradiated with the laser light L due to the foreign object 8 may be formed in the interface between the support substrate 9 and the flexible substrate 11, for example, as illustrated in FIG. 6. In other words, the unirradiated region A103 corresponds to a region hidden behind the foreign object 8 when the display unit 1 is irradiated with the laser light L. The unirradiated region A103 formed in this manner may make the support substrate 9 unlikely or difficult to be detached from the flexible substrate 11. That is, a region that is difficult to be detached may be partially formed in the interface between the support substrate 9 and the flexible substrate 11. Thus, using the method, the method of manufacturing the display unit 1 according to the comparative example may result in a decrease in a manufacturing yield rate.

Embodiment

In contrast, when the support substrate 9 is detached from the flexible substrate 11 in the method of manufacturing the display unit 1 according to this embodiment, the display unit 1 is irradiated with laser light in the following manner. That is, in this embodiment, an interface and its vicinity between the support substrate 9 and the flexible substrate 11 may be irradiated obliquely with the laser light in multi-directions, namely, in two or more directions from the back surface S2 of the support substrate 9. The support substrate 9 thereby may be detached from the flexible substrate 11.

Figure 7:
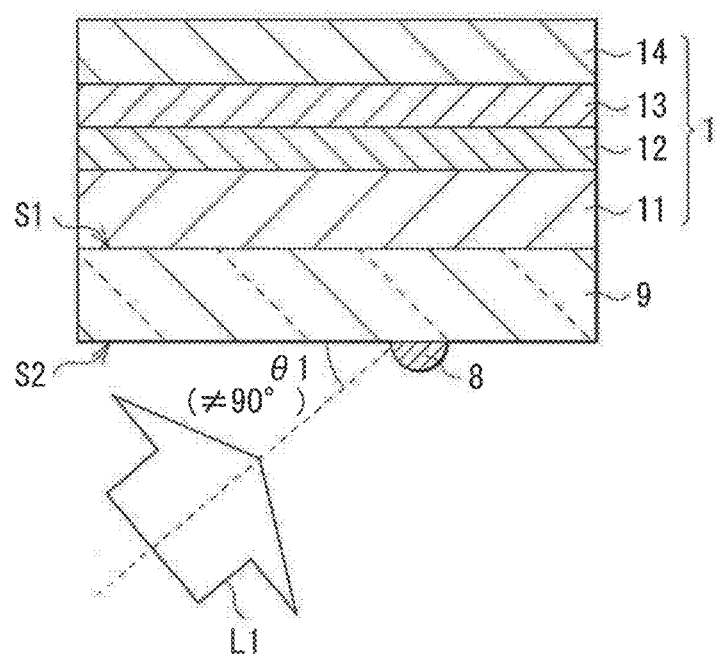
FIG. 7 is a schematic cross-sectional view of an example of oblique irradiation with laser light according to the first embodiment.

More specifically, the interface and its vicinity between the support substrate 9 and the flexible substrate 11 may be irradiated obliquely with laser light from the back surface S2 of the support substrate 9, for example, as illustrated in FIG. 7. This process is referred to as a first oblique laser light irradiation. More particularly, in this first oblique laser light irradiation, a first irradiation angle or incident angle $\theta 1$ of the laser light L1 with respect to the interface may be set so as to satisfy the relationship of $0°<\theta 1<90°$ ($\neq 90°$).

Figure 8:
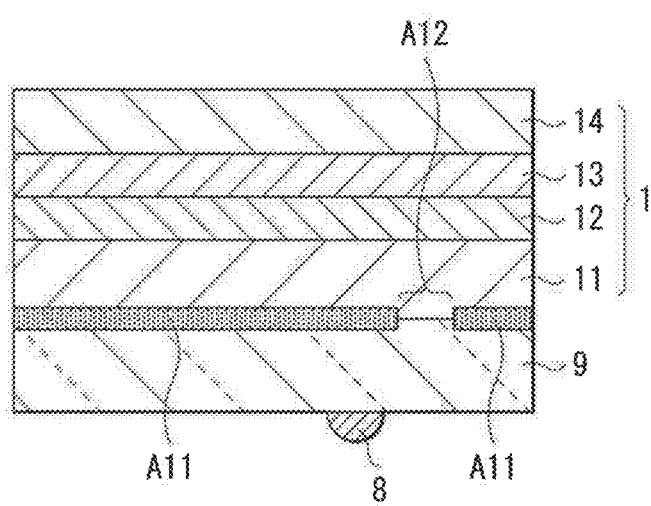
FIG. 8 is a schematic cross-sectional view of an example of a laser-light-irradiated region and a laser-light-unirradiated region illustrated in FIG. 7.

When a foreign object 8 is present on the support substrate 9, especially on the back surface S2 of the support substrate 9, in the same manner as the above comparative example, as illustrated in FIG. 7, a region A11 irradiated with the laser light L1 and a region A12 unirradiated with the laser light L1 due to the foreign object 8 may be formed in the interface between the support substrate 9 and the flexible substrate 11, for example, as illustrated in FIG. 8. In this embodiment, however, the interface is irradiated obliquely with the laser light L1, unlike the laser light in the comparative example. Therefore, the foreign object 8 on the support substrate 9 is misaligned from the unirradiated region A12 in the interface, in accordance with the magnitude of the irradiation angle $\theta 1$.

Figure 9:
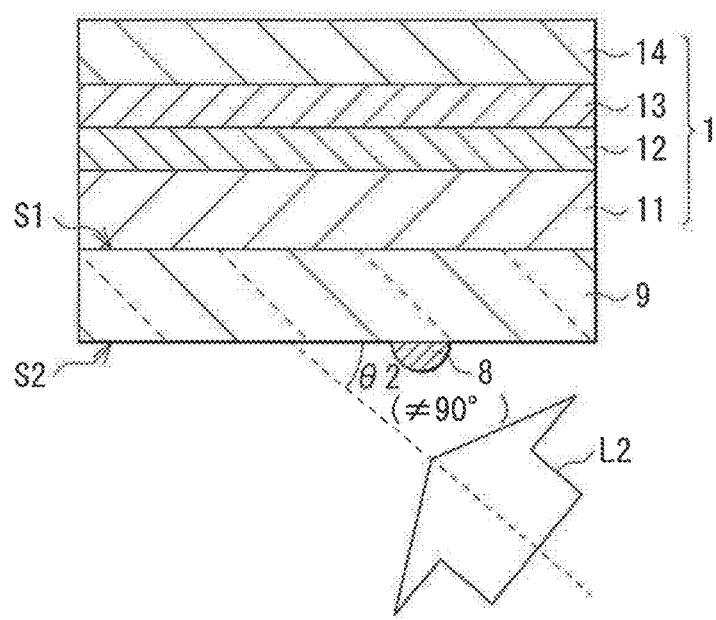
FIG. 9 is a schematic cross-sectional view of another example of the oblique irradiation with laser light according to the first embodiment.

Subsequently, the interface and its vicinity between the support substrate 9 and the flexible substrate 11 may be irradiated again obliquely with laser light L2 from the back surface S2 of the support substrate 9, for example, as illustrated in FIG. 9. This process is referred to as a second oblique laser light irradiation. More Particularly, in this second oblique laser light irradiation, a second irradiation angle $\theta 2$, which is different from the first irradiation angle $\theta 1$, of the laser light L2 with respect to the interface may be set so as to satisfy the relationship of $0°<\theta 2<90°$ ($\neq 90°$). By setting the first irradiation angle $\theta 1$ and the second irradiation angle $\theta 2$ to have different values ($\theta 1 \neq \theta 2$), it is possible to achieve multidirectional oblique laser light irradiation.

Figure 10:
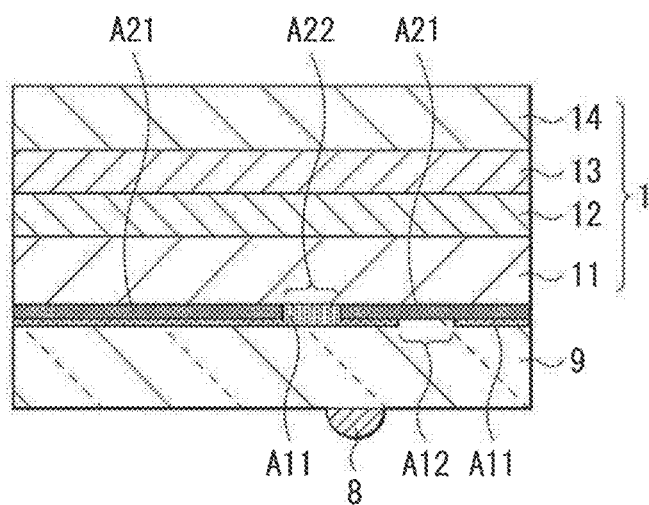
FIG. 10 is a schematic cross-sectional view of an example of a laser-light-irradiated region and a laser-light-unirradiated region illustrated in FIG. 9.

Also when the second oblique laser light irradiation is performed, a region A21 irradiated with the laser light L2 and a region A22 unirradiated with the laser light L2 due to the foreign object 8 may be formed in the interface between the support substrate 9 and the flexible substrate 11, for example, as illustrated in FIG. 10. However, the first irradiation angle $\theta 1$ and the second irradiation angle $\theta 2$ are set to have different values, as described above. This reduces or eliminates any region unirradiated with both of the laser light L1 and the laser light L2, namely, any region not irradiated at all with the laser light, in the entire interface between the support substrate 9 and the flexible substrate 11. In the example of FIG. 10, there is no region that is unirradiated with both of the laser light L1 and the laser light L2 in the entire region of the interface.

In this embodiment, as described above, the interface and its vicinity between the support substrate 9 and the flexible substrate 11 is irradiated obliquely with laser light in multi-directions. The support substrate 9 is thereby detached from the flexible substrate 11. This method reduces or eliminates formation of any laser-light-unirradiated region due to the foreign object or flaw, for example, even when any foreign object or flaw is present on the support substrate 9. As a result, a region where the support substrate 9 is difficult to be detached from the flexible substrate 11 is unlikely or difficult to be formed in the interface between the support substrate 9 and the flexible substrate 11.

Figure 11:
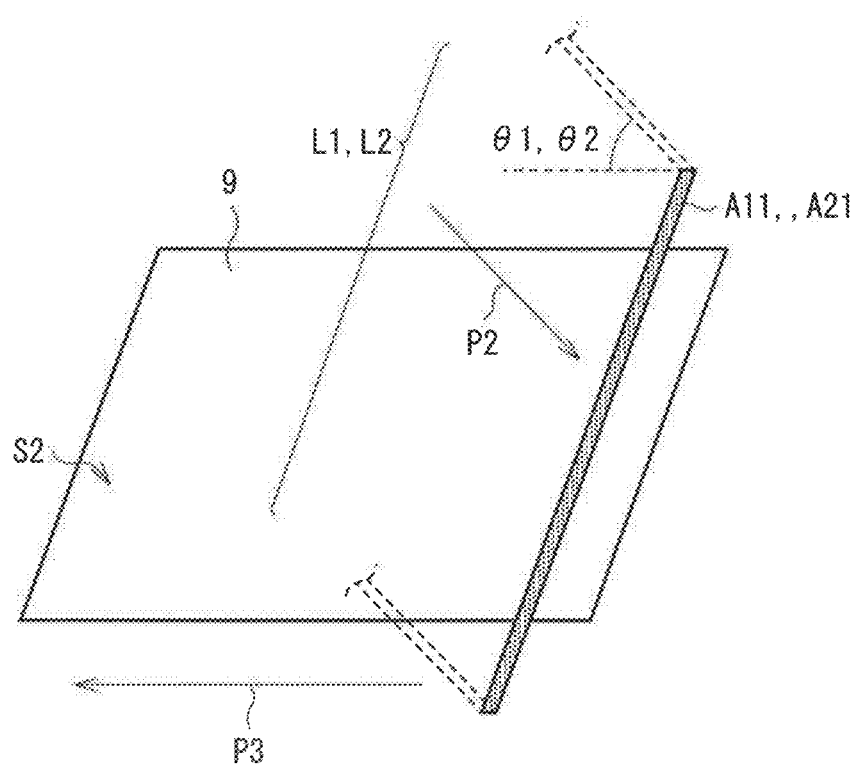
FIG. 11 is a schematic perspective view of a specific example of the oblique irradiation with laser light according to the first embodiment.

More specifically, according to the foregoing embodiment, multidirectional oblique irradiation with laser light is performed, for example, as illustrated in FIG. 11. That is, for example, regions A11 irradiated with the laser light L1 and regions A21 irradiated with the laser light L2, each of which is linear or rectangular in shape, are sequentially displaced from one another in a direction along a plane in the vicinity of the interface between the support substrate 9 and the flexible substrate 11, as indicated by an arrow P3 of FIG. 11. In this manner, the display unit 1 is irradiated obliquely with the laser light L1 and the laser light L2, as indicated by an arrow P2 of FIG. 11. In other words, for example, the display unit 1 may be scanned and irradiated with the laser light L1 and the laser light L2 in oblique directions, in such a way that the irradiated regions A11 and A21, each of which is linear in shape, are sequentially displaced from one another.

To perform such multidirectional oblique irradiation with laser light, for example, one or a plurality of laser light sources may be used for the laser light irradiation. Furthermore, this multidirectional oblique laser light irradiation may be performed at a single step or at multiple steps, as described later in detail in Application Example 1.

In this embodiment, as described above, an interface and its vicinity between the support substrate 9 and the flexible substrate 11 is irradiated obliquely with laser light in multi-directions. The support substrate 9 is thereby detached from the flexible substrate 11. This method makes it possible to reduce or eliminate the risk of any laser-light-unirradiated region being formed due to a foreign object or flaw on the support substrate 9. Consequently, it is possible to manufacture the display unit 1 at an improved yield rate.

2. Application Example 1

Next, a description is given of Application Example 1 in which the method of manufacturing the display unit 1 according to the foregoing embodiment is applied to manufacturing apparatuses. In other words, a description is given of the apparatuses for manufacturing the display unit 1 for achieving the method of manufacturing the display unit 1 described in the first embodiment. In the following description, the same components as those in the foregoing embodiment are given the same reference numerals, and description therefor is omitted where appropriate.

FIRST EXAMPLE

Figure 12:
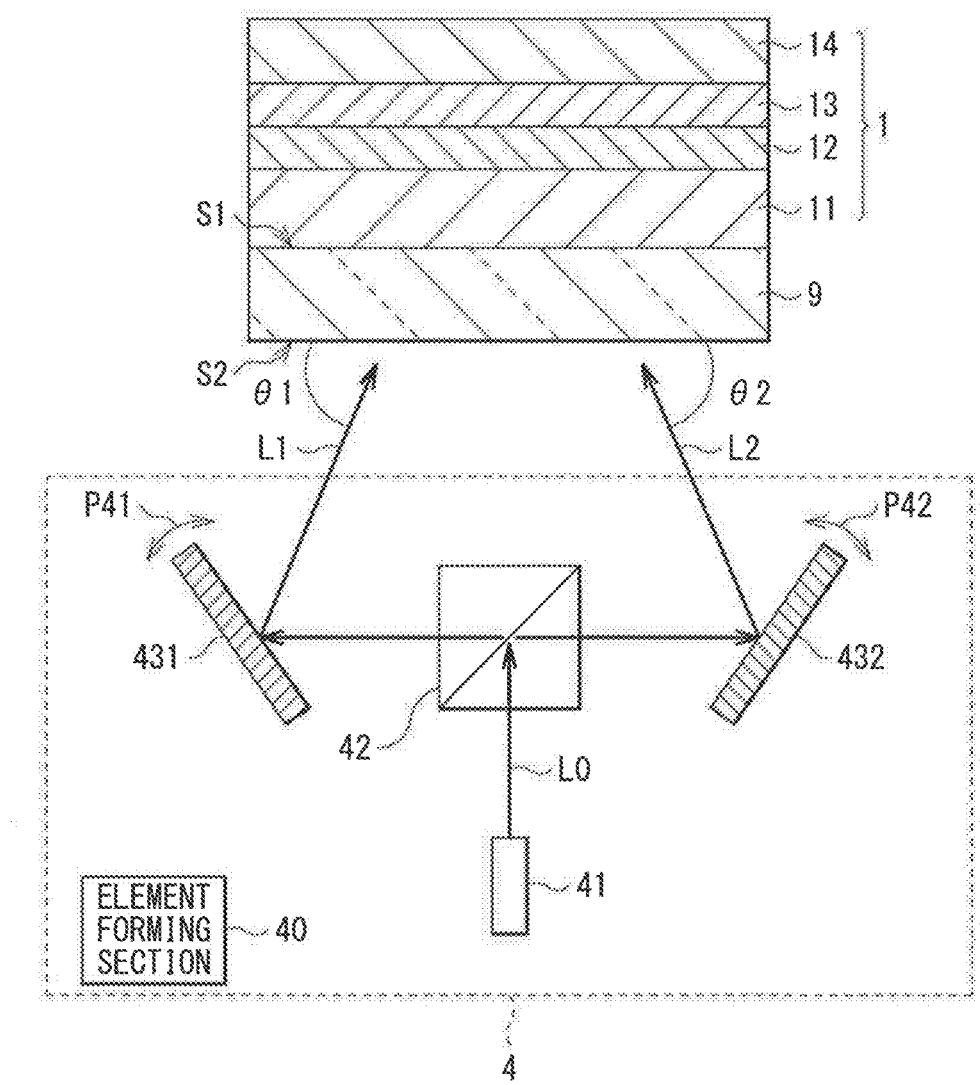
FIG. 12 is a schematic view of an example (first example) of a configuration of an apparatus for manufacturing a flexible device, according to Application Example 1.

FIG. 12 schematically illustrates a first example of a configuration of an apparatus for manufacturing a flexible device, according to Application Example 1. Thereafter, the manufacturing apparatus is referred to as a manufacturing apparatus 4, and the flexible device is referred to as a display unit 1. FIG. 12 also illustrates an example of a cross-sectional configuration of the display unit 1. The manufacturing apparatus 4 includes an element forming section 40, a laser light source 41, a beam splitter 42, and two mirrors 431 and 432.

The element forming section 40 may be a mechanical part that forms layers such as element layers, including a TFT layer 12, a display element layer 13, and a protection layer 14 in this example, on the front surface of a flexible substrate 11 through the various forming processes described in the above-described embodiment. In this case, a support substrate 9 is joined to the back surface of the flexible substrate 11.

The laser light source 41 may be a light source that emits laser light L0 from a back surface S2 of the support substrate 9 to an interface and its vicinity between the support substrate 9 and the flexible substrate 11. In this first example, only a single laser light source 41 may be provided. In this example, the single laser light source 41 may emit the laser light L0 in a direction vertical to the interface between the support substrate 9 and the flexible substrate 11.

The beam splitter 42 may be an optical member that splits the optical path of the laser light L0 emitted from the laser light source 41 into optical paths extending in multi-directions, i.e., in two directions in this example. More specifically, in this example, the beam splitter 42 may reflect the laser light L0 at substantially right angles, thus splitting the optical path of the laser light L0 into the optical paths extending in the two directions.

The mirrors 431 and 432 may be optical members that reflect the laser light outputted from the beam splitter 42 to travel along the optical paths, thereby respectively outputting the above laser light L1 and laser light L2 to the interface and its vicinity between the support substrate 9 and the flexible substrate 11. This allows multidirectional oblique irradiation with the laser light L1 and the laser light L2 to be achieved.

The manufacturing apparatus 4 as configured above irradiates the interface and its vicinity between the support substrate 9 and the flexible substrate 11 obliquely with laser light in multi-directions, in the same manner as the foregoing embodiment. The support substrate 9 is thereby detached from the flexible substrate 11. Thus, by manufacturing the display unit 1 with the manufacturing apparatus 4, it is possible to achieve substantially the same effects brought by the workings similar to those in the foregoing embodiment. Specifically, it is possible to reduce or eliminate the risk of any laser-light-unirradiated region being formed due to a foreign object or flaw on the support substrate 9. Consequently, it is possible to manufacture the display unit 1 at an improved yield rate.

In order to irradiate the interface and its vicinity obliquely with the laser light in multi-directions, the manufacturing apparatus 4 in this first example emits laser light, namely, the original laser light L0 only once. More specifically, in order for the manufacturing apparatus 4 to perform the multidirectional oblique irradiation by emitting the laser light L0 only once, the beam splitter 42 splits the optical path of the laser light L0 emitted from the laser light source 41 into a plurality of optical paths. Therefore, particularly in this example, the manufacturing apparatus 4 has only to be provided with a single laser light source 41. This configuration contributes to a reduction in the cost for members provided in the manufacturing apparatus 4.

The manufacturing apparatus 4 in the first example may be designed such that angles at which the mirrors 431 and 432 reflect the laser light are variable, for example, as indicated by arrows P41 and P42 in FIG. 12, so that the oblique irradiation angles θ1 and θ2 of the laser light L1 and the laser light L2 are thereby adjustable. This design enables the locations of a region A11 irradiated with the laser light L1 and a region A21 irradiated with the laser light L2 to be finely adjusted, thereby helping an improvement in a production yield rate and providing a user with enhanced usability.

SECOND EXAMPLE

Figure 13:
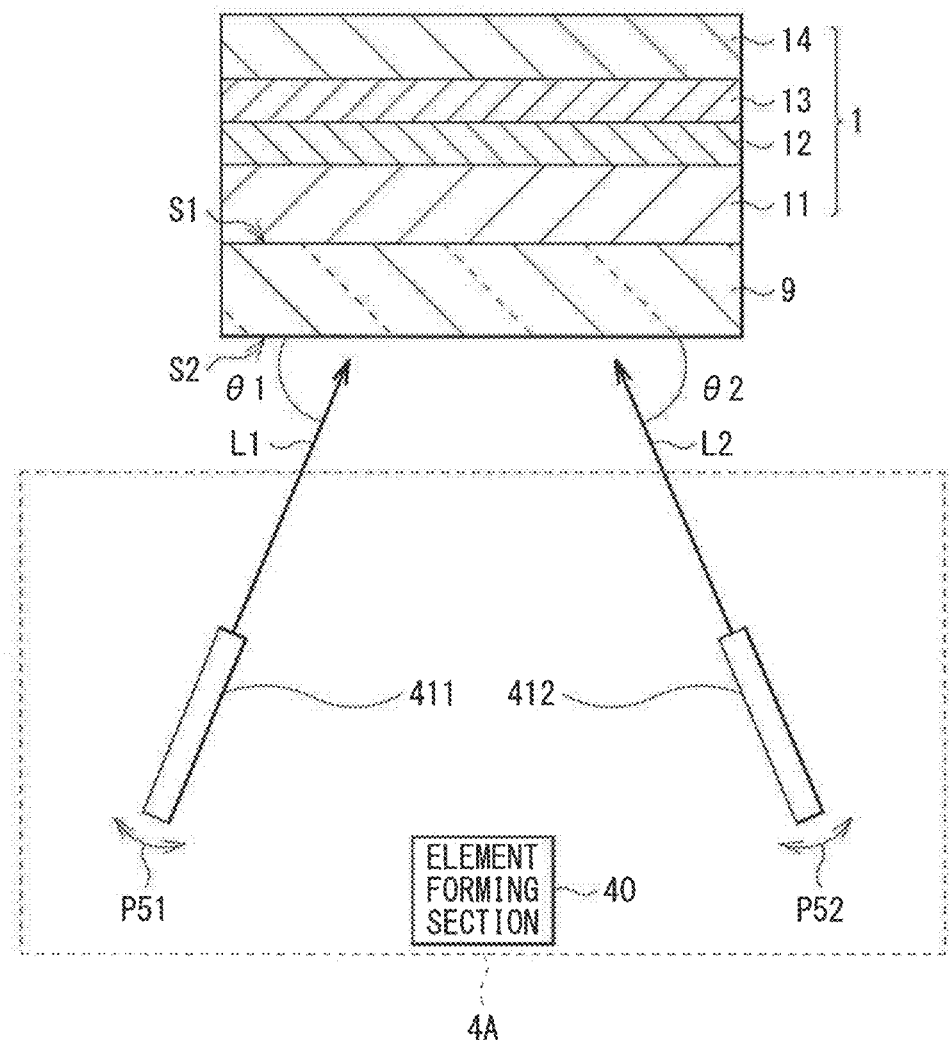
FIG. 13 is a schematic view of an example (second example) of the configuration of the apparatus for manufacturing the flexible device, according to Application Example 1.

FIG. 13 schematically illustrates a second example of the configuration of the apparatus for manufacturing a display unit 1 according to Application Example 1. The manufacturing apparatus is referred to below as a manufacturing apparatus 4A. FIG. 13 also illustrates an example of a cross-sectional configuration of the display unit 1. The manufacturing apparatus 4A may include an element forming section 40 and a plurality of laser light sources, more specifically two laser light sources 411 and 412.

The laser light source 411 may be a light source that emits laser light L1 to an interface and its vicinity between a support substrate 9 and a flexible substrate 11 at an irradiation angle θ1, thereby performing oblique irradiation with the laser light L1. Likewise, the laser light source 412 may be a light source that emits laser light L2 to the interface and its vicinity between the support substrate 9 and the flexible substrate 11 at an irradiation angle θ2, thereby performing oblique irradiation with the laser light L2. In this second example, thus, the laser light sources 411 and 412 individually emit the laser light L1 and the laser light L2, respectively, in oblique directions, thereby performing the multi-directional oblique irradiation with the laser light.

The manufacturing apparatus 4A as configured above irradiates the interface and its vicinity between the support substrate 9 and the flexible substrate 11 obliquely with laser light in multi-directions, in the same manner as the foregoing embodiment. The support substrate 9 is thereby detached from the flexible substrate 11. Thus, by manufacturing the display unit 1 with the manufacturing apparatus 4A, it is possible to achieve substantially the same effects brought by workings substantially the same as those in the foregoing embodiment. Specifically, it is possible to reduce or eliminate the risk of any laser-light-unirradiated region being formed due to a foreign object or flaw on the support substrate 9. Consequently, it is possible to manufacture the display unit 1 at an improved yield rate.

In the second example, the plurality of laser light sources 411 and 412 individually emit, respectively, the laser light L1 and the laser light L2 in oblique directions, thereby performing multidirectional oblique irradiation with the laser light. More specifically, in order to irradiate the interface and its vicinity obliquely with the laser light in multi-directions, the manufacturing apparatus 4A emits the laser light at a single step or at multiple steps. Therefore, in the manufacturing apparatus 4A in this second example, the power of each of the laser light L1 and the laser light L2 emitted, respectively, from the laser light sources 411 and 412 may be suppressed to about a half the power emitted from the laser light source 41 in the foregoing first example. This makes it also possible to save the electricity in the manufacturing apparatus 4A.

The manufacturing apparatus 4A in the second example may be designed such that angles at which respective orientations or angles of the laser light sources 411 and 412 are variable, for example, as indicated by arrows P51 and P52 in FIG. 13, so that oblique irradiation angles θ1 and θ2 of the laser light L1 and the laser light L2, respectively, are thereby adjustable. This design enables the locations of a region A11 irradiated with the laser light L1 and a region A21 irradiated with the laser light L2 to be finely adjusted, thereby helping an improvement in a production yield rate and providing a user with enhanced usability.

THIRD EXAMPLE

Figure 14A:
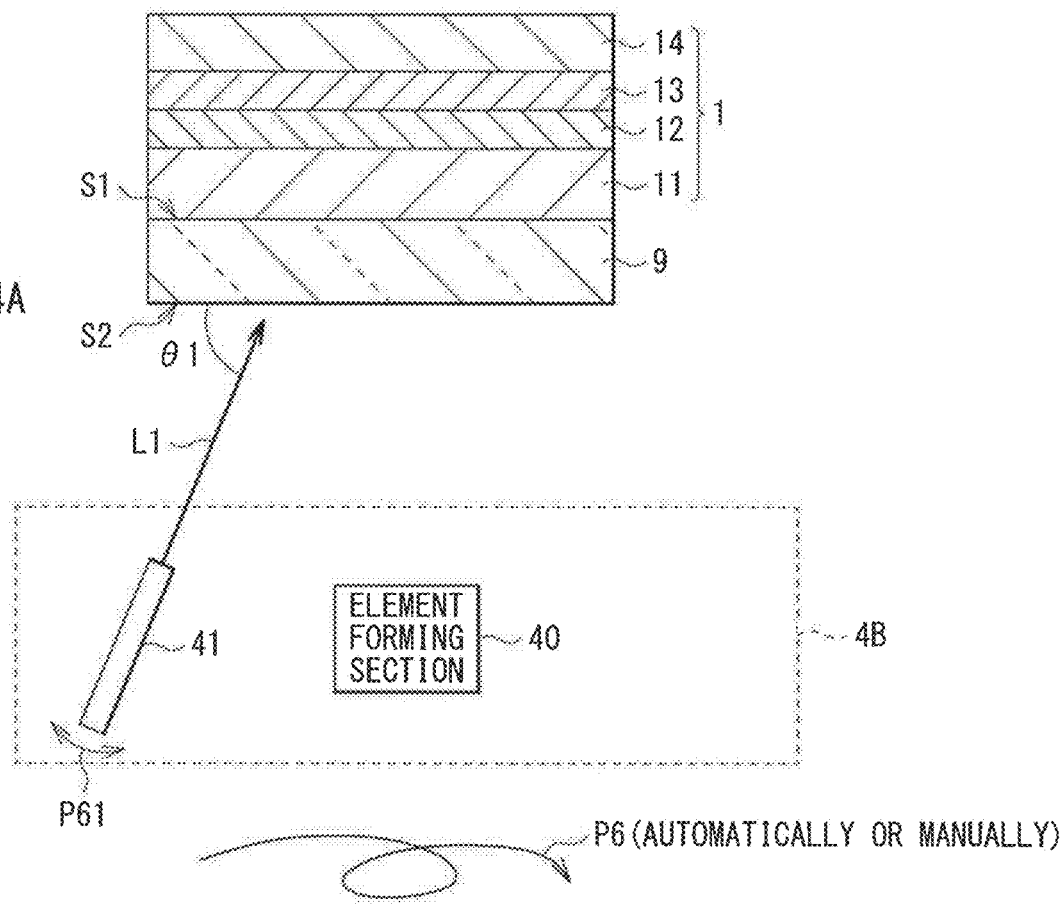
FIG. 14A is a schematic view of an example (third example) of the configuration of the apparatus for manufacturing the flexible device, according to Application Example 1.
Figure 14B:
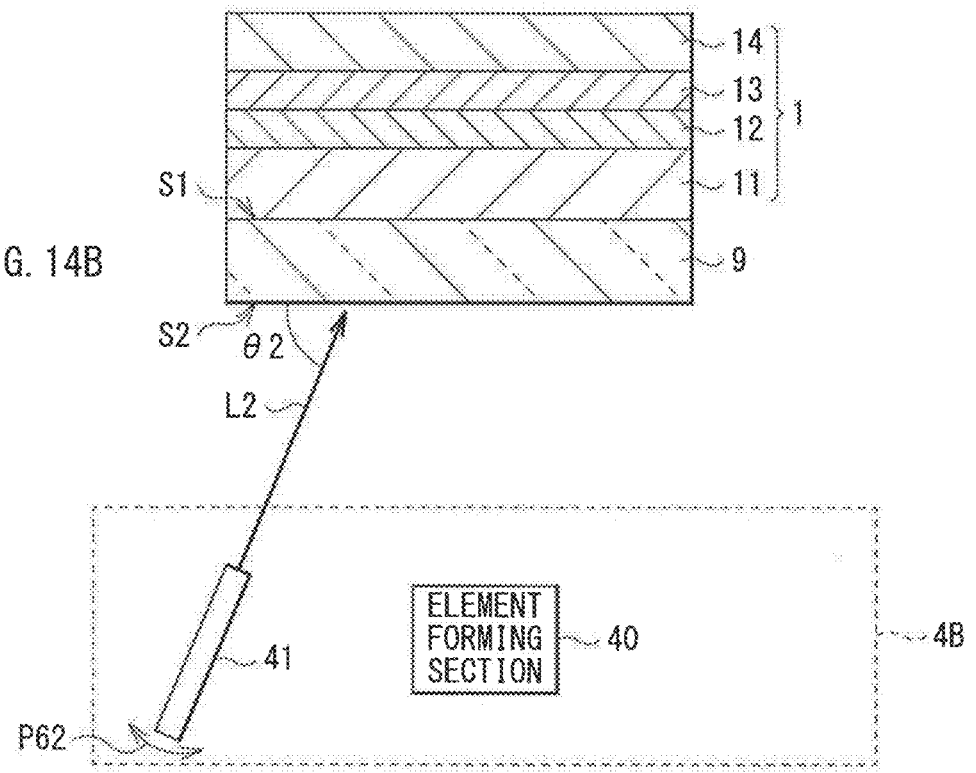
FIG. 14B is a schematic view of an example (third example) of the configuration of the apparatus for manufacturing the flexible device, according to Application Example 1.

FIGS. 14A and 14B schematically illustrate a third example of the configuration of the apparatus for manufacturing a display unit 1 according to Application Example 1. The manufacturing apparatus is referred to below as a manufacturing apparatus 4B. FIGS. 14A and 14B also illustrate an example of a cross-sectional configuration of the display unit 1. The manufacturing apparatus 4B may include an element forming section 40 and a single laser light source 41.

The laser light source 41 in this third example may be a light source that emits laser light L1 at an irradiation angle θ1 to an interface and its vicinity between a support substrate 9 and a flexible substrate 11 and also emits laser light L2 thereto at an irradiation angle θ2. The display unit 1 thereby may perform the oblique irradiation with the laser light L1 and the laser light L2. In this case, the irradiation angles θ1 and θ2 at which the laser light source 41 emits, respectively, the laser light L1 and the laser light L2 may be fixed.

In this third example, the support substrate 9 may rotate in a direction along its plane between a first oblique irradiation with the laser light L1 and a second oblique irradiation with the laser light L2, for example, as indicated by an arrow P6 of FIG. 14B. In conjunction with the rotation of the support substrate 9, the whole of the display unit 1 disposed on the support substrate 9 may also rotate in the same direction. In this case, for example, the rotational motion of the support substrate 9 may be made either automatically by a rotation mechanism provided in the manufacturing apparatus 4B or manually by a user's operation. In the third example, thus, the support substrate 9 may rotate in a direction along its plane every time the single laser light source 41 emits laser light in an oblique direction. This allows for the multidirectional oblique irradiation with the laser light.

The manufacturing apparatus 4B as configured above irradiates the interface and its vicinity between the support substrate 9 and the flexible substrate 11 obliquely with laser light in multi-directions, in the same manner as the foregoing embodiment. The support substrate 9 is thereby detached from the flexible substrate 11. Thus, by manufacturing the display unit 1 with the manufacturing apparatus 4B, it is possible to achieve substantially the same effects brought by workings substantially the same as those in the foregoing embodiment. Specifically, it is possible to reduce or eliminate the risk of any laser-light-unirradiated region being formed due to a foreign object or flaw on the support substrate 9. Consequently, it is possible to manufacture the display unit 1 at an improved yield rate.

In this third example, the oblique irradiation may be performed by the laser light source 41. Subsequently, the support substrate 9 may rotate in a direction along its plane. Thereafter, another oblique irradiation may be performed by the laser light source 41. In this way, the multidirectional oblique laser light irradiation is achieved. Therefore, it is possible to provide the manufacturing apparatus 4B in the third example with a simple configuration.

The manufacturing apparatus 4B in the third example may be designed such that angles at which an orientation or angle of the laser light source 41 is variable, for example, as indicated by an arrow P61 in FIG. 14A and an arrow P62 in FIG. 14B, so that oblique irradiation angles θ1 and θ2 of the laser light L1 and the laser light L2, respectively, are thereby adjustable. This design enables the locations of a region A11 irradiated with the laser light L1 and a region A21 irradiated with the laser light L2 to be finely adjusted, thereby helping an improvement in a production yield rate and providing a user with enhanced usability.

Next, other embodiments and their modification examples are described below. In this description, the same components as those in the foregoing first embodiment are given the same reference numerals, and description therefor is omitted where appropriate e.

3. Second Embodiment

Figure 15:
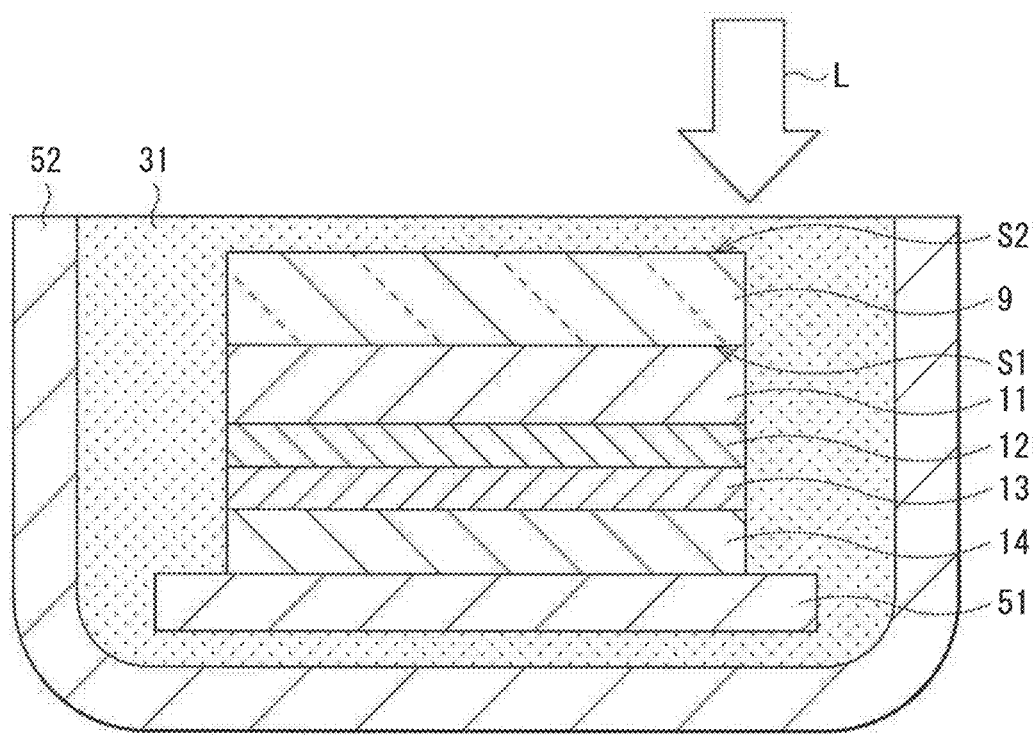
FIG. 15 is a schematic cross-sectional view of one step of a method of manufacturing a flexible device, according to a second embodiment of the disclosure.

In a method of manufacturing a display unit 1 according to a second embodiment, a back surface S2 of a support substrate 9 may be brought into contact with a liquid 31 as a flowable member, as illustrated in FIG. 15. Thereafter, the irradiation with laser light L may be performed. Examples of the liquid 31 may include cooking oil and an organic solvent. The liquid 31 may preferably have a refractive index that is closer to that of the constituent material for the support substrate 9 than a refractive index of air. More preferably, the refractive index of the liquid 31 may be preferably equal to or substantially equal to a refractive index of the constituent material for the support substrate 9. For example, the refractive index of the liquid 31 may be more than the refractive index of air, i.e., 1.0, but equal to or smaller than the refractive index of the constituent material for the support substrate 9. The expression "the refractive index of the liquid 31 is substantially equal to the refractive index of the constituent material for the support substrate 9" may mean that the refractive index of the liquid 31 falls within the range from about 98% to 100% of the refractive index of the constituent material for the support substrate 9. When the support substrate 9 is made of glass having a refractive index of about 1.52, the refractive index of the liquid 31 may fall within the range from about 1.49 to 1.52, for example.

[Manufacturing Method]

Using the liquid 31, the display unit 1 may be manufactured through the following processing, for example.

A front surface S1 of the support substrate 9 may be joined to the back surface of a flexible substrate 11, in the same manner as the foregoing first embodiment. After the support substrate 9 has been joined to the flexible substrate 11, an element layer that includes a TFT layer 12 and a display element layer 13 may be formed on the front surface of the flexible substrate 11. Thereafter, a protection layer 14 made of any of the above materials may be formed on the display element layer 13 by a chemical vapor deposition (CVD), for example.

After the protection layer 14 is formed, the back surface S2 of the support substrate 9 may be brought into contact with the liquid 31, for example, as illustrated in FIG. 15. More specifically, the support substrate 9, the flexible substrate 11, the TFT layer 12, the display element layer 13, and the protection layer 14 may be mounted on a stage 51 and then put into a container 52 filled with the liquid 31. In this case, the support substrate 9, for example, may be fixed to the stage 51, with the front surface S1 facing the stage 51 and the back surface S2 facing the opposite of the stage 51. The support substrate 9 may be sufficiently deeply put into the container 52 until the whole of the back surface S2 is positioned under the surface of the liquid 31, so that the whole back surface S2 of the support substrate 9 is brought into contact with the liquid 31.

While the back surface S2 of the support substrate 9 is in contact with the liquid 31 as described above, irradiation with the laser light L may be performed from the back surface S2 of the support substrate 9. Thereafter, the support substrate 9, the flexible substrate 11, the TFT layer 12, the display element layer 13, and the protection layer 14 are taken out of the container 52. Thereafter, the support substrate 9 is detached from the flexible substrate 11, as indicated by the arrow P1 of FIG. 2B.

Through the above processing, the display unit 1 illustrated in FIG. 1 has been completed.

[Workings and Effects]

COMPARATIVE EXAMPLE

The method of manufacturing the display unit 1 according to the second embodiment is compared with the method of manufacturing the display unit 1 illustrated in FIGS. 3 and 4 according to the comparative example. The manufacturing method according to the comparative example may be similar to that according to the second embodiment described above. Specifically, in the manufacturing method according to the comparative example, the individual layers, namely, the TFT layer 12, the display element layer 13, and the protection layer 14 may be formed on the flexible substrate 11. Thereafter, the support substrate 9 may be detached from the flexible substrate 11 utilizing the irradiation with the laser light L.

More specifically, the interface and its vicinity between the support substrate 9 and the flexible substrate 11 is irradiated with the laser light L in a vertical direction from the back surface S2 of the support substrate 9, for example, as illustrated in FIG. 3. As a result of this irradiation, the region A101 irradiated with the laser light L, which corresponds to the entire region of the interface between the support substrate 9 and the flexible substrate 11 in this example, may be formed, for example, as illustrated in FIG. 4. This enables the support substrate 9 to be detached from the flexible substrate 11. Within this irradiated region A101, the support substrate 9 may be joined to the flexible substrate 11 at a weak sticking force.

Figure 16:
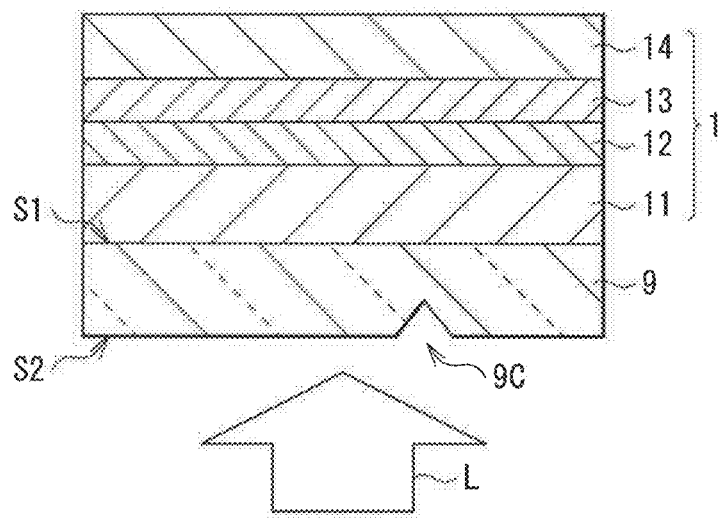
FIG. 16 is a schematic cross-sectional view of an example of an overall configuration of the flexible device in which a flaw is present in the support substrate illustrated in FIG. 3.

In some cases, a flaw 9C or similar fault is likely to be generated on the back surface S2 of the support substrate 9 during the manufacturing process, for example, as illustrated in FIG. 16. One reason why the flaw 9C is likely to be generated on the back surface S2 of the support substrate 9 is that the back surface S2 of the support substrate 9 is brought into contact with a manufacturing apparatus or is exposed to a reagent or to the atmosphere of a reactant gas, during the manufacturing process. Furthermore, there are cases where any foreign object, such as the foreign object 8 illustrated in FIG. 5, adheres to the back surface S2 of the support substrate 9. Therefore, when the support substrate 9 is detached from the flexible substrate 11 utilizing the laser light L, the following disadvantage may arise in the comparative example.

Figure 17:
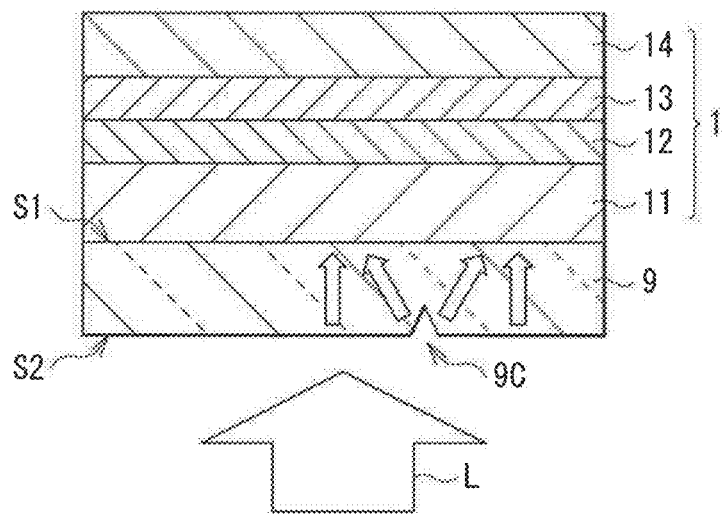
FIG. 17 is a schematic cross-sectional view of an example of the flexible device illustrated in FIG. 16 in which laser light propagates.

As illustrated in FIG. 17, when the laser light L incident on a region adjacent to the flaw 9C may be refracted, there is a difference in an incident angle of the laser light L between a part without the flaw 9C and a part of the flaw 9C. Therefore, the laser light L incident on the part of the flaw 9C may fail to reach the interface between the support substrate 9 and the flexible substrate 11.

Figure 18:
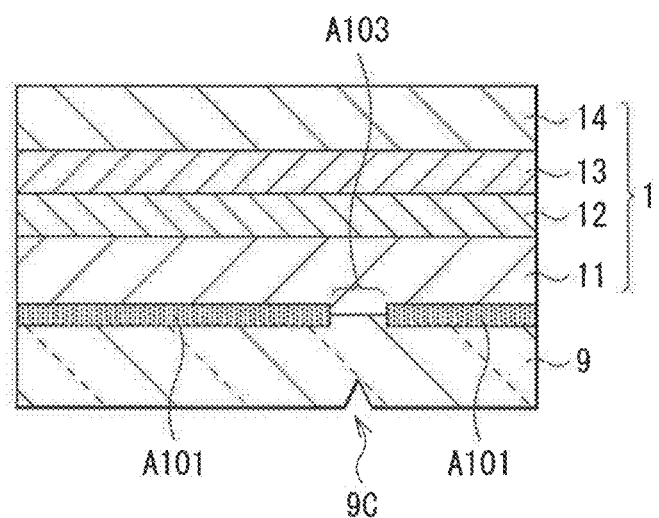
FIG. 18 is a schematic cross-sectional view of an example of a laser-light-irradiated region and a laser-light-unirradiated region illustrated in FIG. 16.

In the above case, as illustrated in FIG. 18, a region A103 unirradiated with the laser light L due to the flaw 9C may be formed in the interface between the support substrate 9 and the flexible substrate 11. This unirradiated region A103 may make the support substrate 9 unlikely or difficult to be detached from the flexible substrate 11. Thus, the method of manufacturing the display unit 1 according to the comparative example may cause disadvantage at the manufacturing step of detaching the support substrate 9 from the flexible substrate 11. Therefore, this method may lead to a decreased production yield rate of the display unit 1. For example, the functions of the display element layer 13 may be lowered during the manufacturing step of detaching the support substrate 9 from the flexible substrate 11.

Figure 19A:
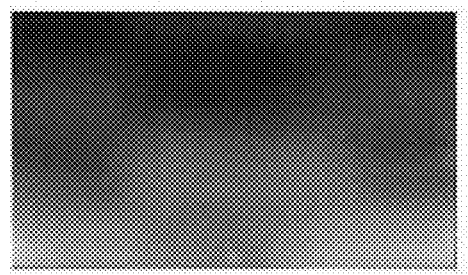
FIG. 19A illustrates an example of a display state before detachment of a support substrate from a flexible substrate.
Figure 19B:
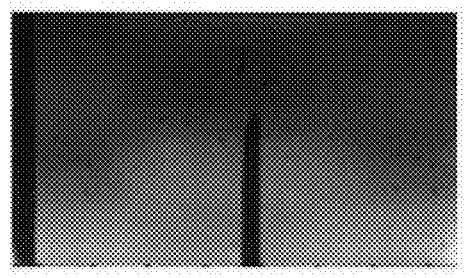
FIG. 19B illustrates an example of a display state after the detachment of the support substrate from the flexible substrate.
Figure 19C:
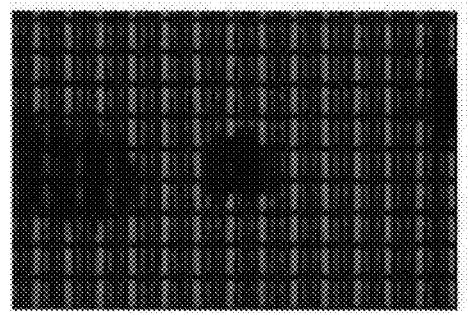
FIG. 19C is an enlarged view of a non-light-emission region illustrated in FIG. 19B.

FIG. 19A illustrates a display state of the display unit 1 before detachment of the support substrate 9 from the flexible substrate 11. FIG. 19B illustrates a display state of the display unit 1 after the detachment of the support substrate 9 from the flexible substrate 11. FIG. 19C illustrates a non-light-emitting region of FIG. 19B in an enlarged manner. As illustrated in FIGS. 19A to 19C, the flaw 9C, a foreign object, and other faults on the back surface S2 of the support substrate 9 may be a cause of any display failure.

Figure 20A:
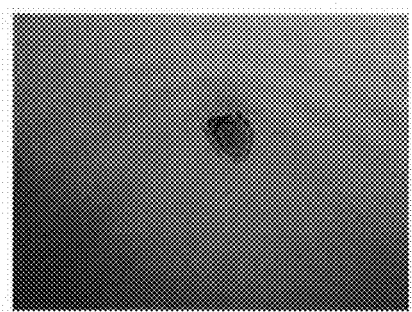
FIG. 20A is a microscope photograph of an example of a front surface of the support substrate.
Figure 20B:
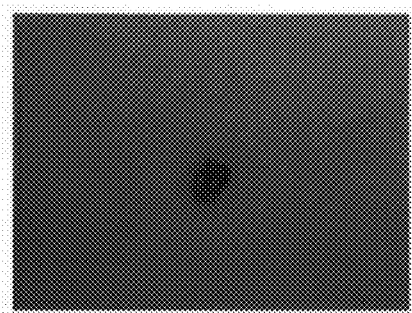
FIG. 20B is a microscope photograph of an example of a back surface of the support substrate.

FIG. 20A is a microscope photograph of the front surface S1 of the support substrate 9. FIG. 20B is a microscope photograph of the back surface S2 of the support substrate 9. From FIGS. 20A and 20B, it is confirmed that the flaw 9C, a foreign object, and other faults present on the back surface S2 of the support substrate 9 may be a cause of generating the unirradiated region A103. Methods such as washing may be conceivable as a method for removing foreign objects. However, using the method of washing may be insufficient to remove foreign objects effectively and be unable to remove the flaw 9C, thus making it difficult to improve a production yield rate.

Embodiment

In contrast, in the manufacturing method according to the present embodiment, the irradiation with the laser light L may be performed, with the back surface S2 of the support substrate 9 being in contact with the liquid 31. Thus, even when the flaw 9C is present on the back surface S2 of the support substrate 9, it becomes possible to allow the laser light L incident on a part of the flaw 9C and the laser light L incident on another part to travel in similar manners. This flaw 9C may correspond to a "recess" in one specific but non-limiting embodiment of the technology.

Figure 21:
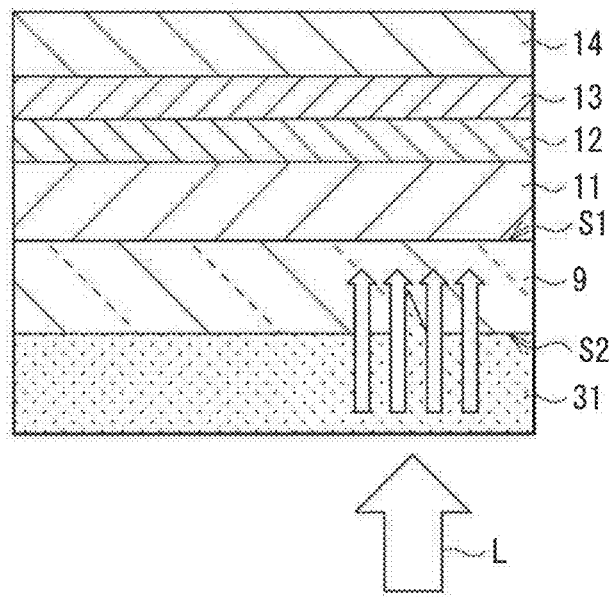
FIG. 21 is an explanatory schematic cross-sectional view of the flexible device irradiated with laser light subsequent to the manufacturing step illustrated in FIG. 15.

More specifically, as illustrated in FIG. 21, when the flaw 9C is present on the back surface S2 of the support substrate 9, the liquid 31 whose refractive index is equal to or substantially equal to that of the constituent material for the support substrate 9 may flow into the flaw 9C. Thereafter, the flaw 9C may be filled with the liquid 31. As a result, the laser light L incident on a part of the flaw 9C and the laser light L incident on another part may travel inside the support substrate 9 in similar manners, and then reach the interface between the support substrate 9 and the flexible substrate 11. Consequently, it is possible to lessen influences of the flaw 9C over the irradiation with the laser light L.

Figure 22:
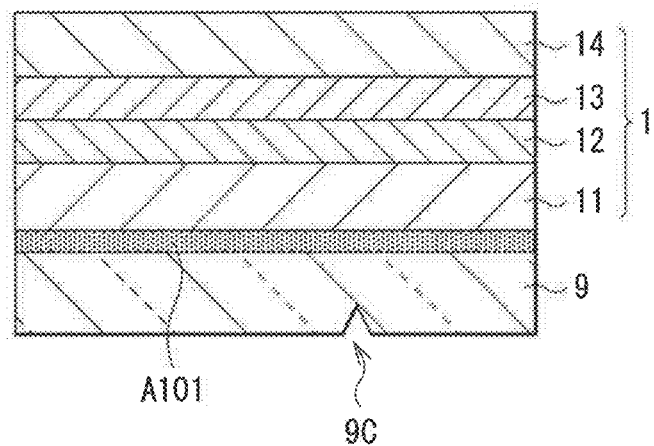
FIG. 22 is a schematic cross-sectional view of an example of a laser-light-irradiated region illustrated in FIG. 21.

FIG. 22 illustrates the region A101 irradiated with the laser light L, which is formed as a result of irradiation with the laser light L, with the back surface S2 of the support substrate 9 being in contact with the liquid 31. By irradiation with the laser light L, with the back surface S2 of the support substrate 9 being in contact with the liquid 31, it is possible to make the unirradiated region A103 unlikely to be formed even when the flaw 9C is present on the back surface S2 of the support substrate 9. This makes it possible to detach the support substrate 9 from the flexible substrate 11 without reducing the functions of the element layer, which includes the TFT layer 12 and the display element layer 13.

A description is given of finding results of the relationship between the refractive index of the liquid 31 and the size of the unirradiated region A103 using a simulation.

Figure 23:
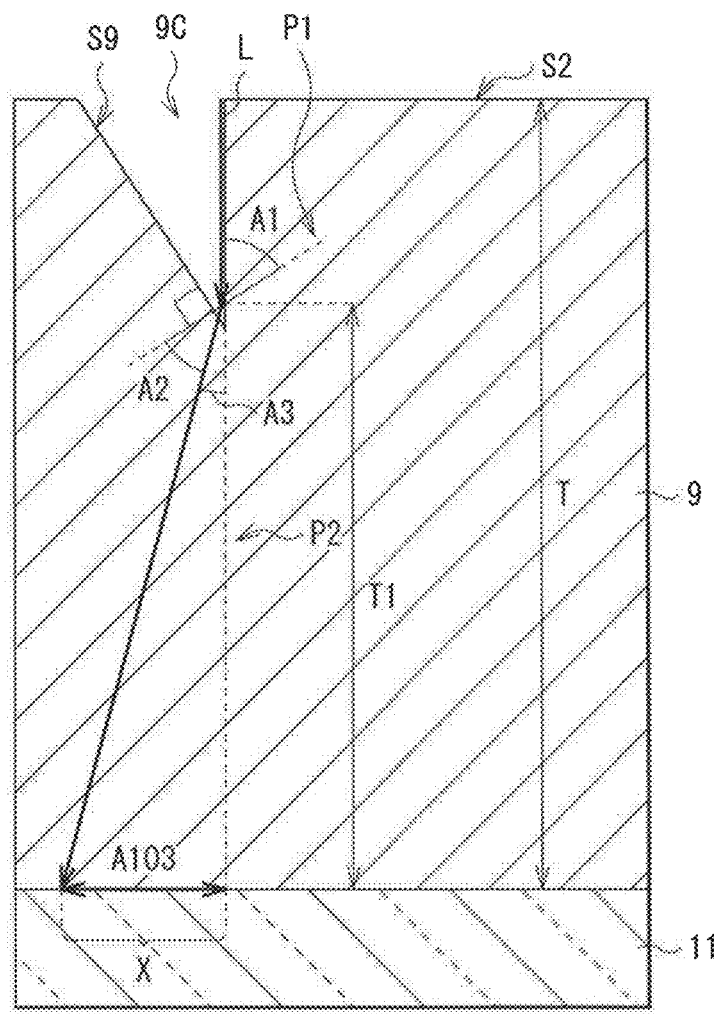
FIG. 23 is an explanatory view of propagation of laser light in the support substrate in which a flaw is present on the back surface.

FIG. 23 schematically illustrates the propagation of the laser light L inside the support substrate 9 when the flaw 9C is present on the back surface S2 of the support substrate 9. An angle A1, which is the angle between the laser light L and a normal PL1 to a flaw surface S9, is deemed to be an incident angle of the laser light L. The laser light L may be refracted and then travel inside the support substrate 9. Thereafter, the laser light L may reach the interface between the support substrate 9 and the flexible substrate 11. The refracted laser light L may form an angle A2 with the normal PL1. The travel direction of the refracted laser light L may form an angle A3 with that of the pre-refracted laser light L. A normal PL2 extending from the flaw 9C to the flexible substrate 11, the direction in which the laser light L travels inside the support substrate 9, and the interface between the support substrate 9 and the flexible substrate 11 may form a right triangle. The side of this right triangle, which coincides with the interface between the support substrate 9 and the flexible substrate 11 may correspond to the unirradiated region A103. A size X of the unirradiated region A103 may be determined using Expressions (1) to (3) described below.

$$A3 = A1 - A2 \quad (1)$$

$$n31 \cdot \sin(A1) = n9 \cdot \sin(A2) \quad (2)$$

$$X = T1 \times \tan(A3) \quad (3),$$

where n31 denotes the refractive index of the liquid 31, n9 denotes the refractive index of the constituent material for the support substrate 9, and T1 denotes the length of the side of the above right triangle, which coincides with the normal PL2. Expression (2) represents the Snell's law. Moreover, by substituting Expressions (1) and (2) into Expression (3), the size X of the unirradiated region A103 may be determined using Expression (4) described below, $$X = T1 \times \tan(A1 - A2) = T1 \times \tan(A1 - \sin^{-1}(n31/n9 \times \sin A1)) \quad (4).$$

The length T1 and the angle A1 vary depending on a shape of the flaw 9C and an incident angle of the laser light L, i.e., the angle A1. Therefore, the relationship between the size X of the unirradiated region A103 and each of the length T1 and the angle A1 is determined using Expression (4).

Figure 24A:
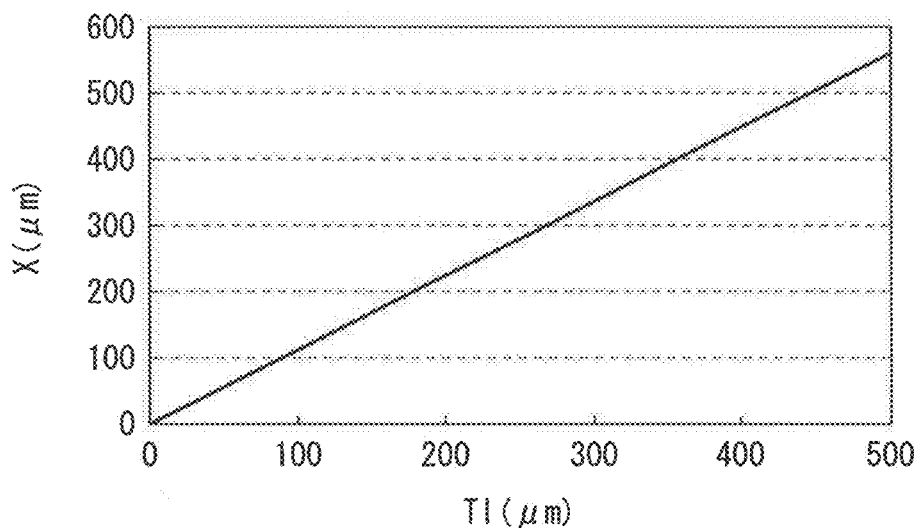
FIG. 24A illustrates the relationship between the length and the size of the unirradiated region illustrated in FIG. 23.
Figure 24B:
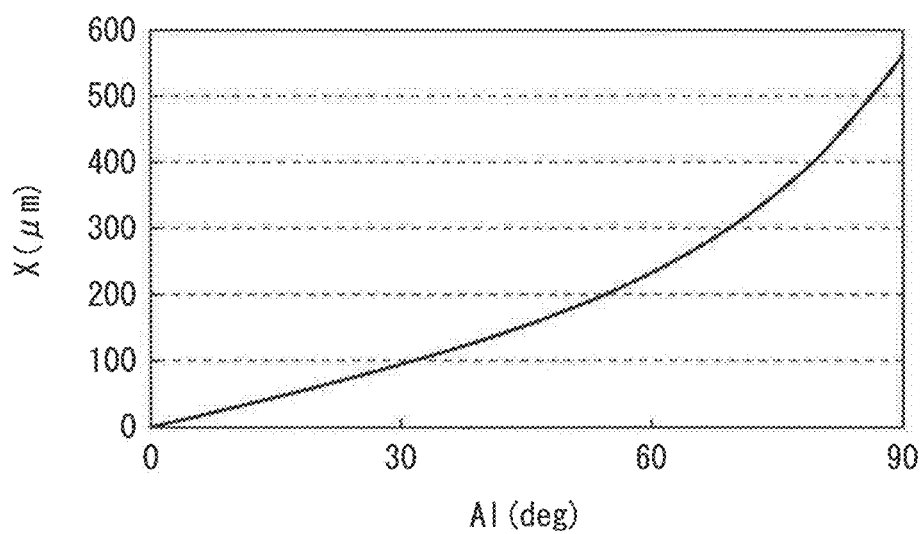
FIG. 24B illustrates the relationship between the incident angle of the laser light and the size of the unirradiated region illustrated in FIG. 23.

FIG. 24A illustrates the relationship between the length T1 and the size X of the unirradiated region A103. FIG. 24B illustrates the relationship between the angle A1 and the size X of the unirradiated region A103. In FIGS. 24A and 24B, the refractive index n31 of the liquid 31 is set to be equal to a refractive index of air, namely, set to 1.0, and the refractive index n9 of the support substrate 9 is set to be equal to that of glass, namely, set to 1.5. The size X of the unirradiated region A103 becomes larger as the length T1 becomes closer to the thickness T of the support substrate 9, namely, as the angle A1 becomes closer to 90°. Thereinafter, the thickness T is set to 500 μm. Thus, a simulation was performed under the condition of the length T1 being set to 500 μm and the angle A1 being set to 90°.

Figure 25A:
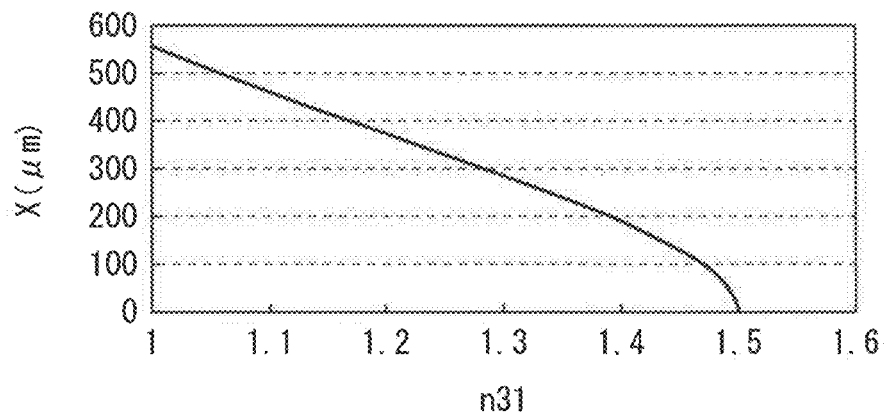
FIG. 25A illustrates simulation results of a range of a refractive index of the liquid.
Figure 25B:
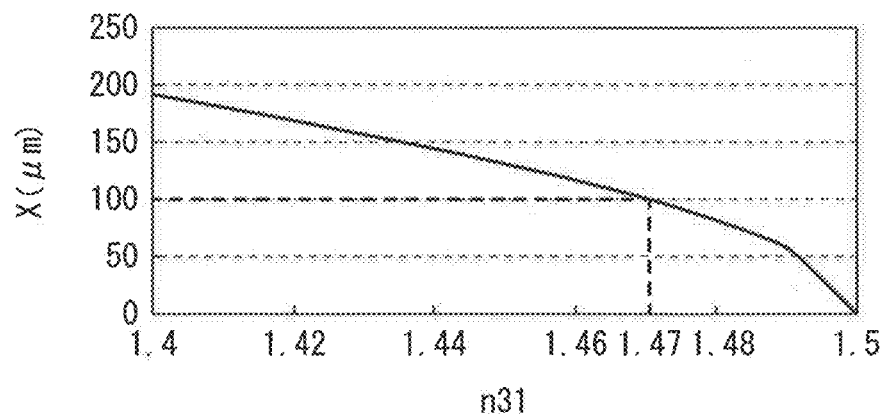
FIG. 25B illustrates a portion of FIG. 15A in an enlarged manner.

FIG. 25A illustrates the simulation results of the relationship between the refractive index n31 of the liquid 31 and the size X of the unirradiated region A103. FIG. 25B illustrates a portion of FIG. 25A in the range of the refractive index n31 from 1.4 to 1.5, in an enlarged manner. In this simulation, the refractive index n9 of the support substrate 9 is set to be equal to the refractive index of glass, namely, set to 1.5, and the refractive index n31 of the liquid 31 is varied in the range from 1.0 to 1.5. The refractive index n31 of the liquid 31 may be preferably equal to or smaller than the refractive index n9 of the support substrate 9. This is because, when the refractive index n31 of the liquid 31 exceeds the refractive index n9 of the support substrate 9, the laser light L may be totally reflected.

When the size X of the unirradiated region A103 exceeds 100 μm, the unirradiated region A103 is highly prone to cause disadvantage associated with light emission. According to FIGS. 25A and 25B, when the refractive index n31 of the liquid 31 falls within the range from 1.47 to 1.5, the size X of the unirradiated region A103 becomes 100 μm or less. In this case, the range of the refractive index n31 of the liquid 31 which may cause the unirradiated region A103 to be shrunk more effectively may be specified by expression (5) described below, $$n9 \geq n31 \geq 0.98 \times n9 \quad (5).$$

In the present embodiment, as described above, the irradiation with the laser light L may be performed, with the back surface S2 of the support substrate 9 being in contact with the liquid 31. Therefore, even when the flaw 9C is present on the back surface S2 of the support substrate 9, the liquid 31 may flow into the flaw 9C. This makes it possible to lessen influences of the flaw 9C over the irradiation with the laser light L. Consequently, it is possible to reduce the risk of any disadvantage arising during a process by which the support substrate 9 is detached from the flexible substrate 11, thereby manufacturing the display unit 1 at an improved yield rate.

4. Modification Example 1

Figure 26A:
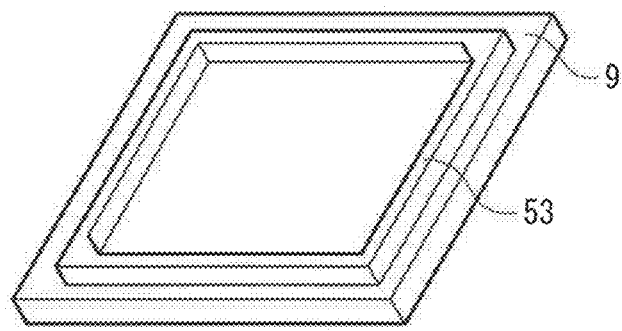
FIG. 26A is an explanatory perspective view of a method of manufacturing a display unit, according to Modification Example 1.
Figure 26B:
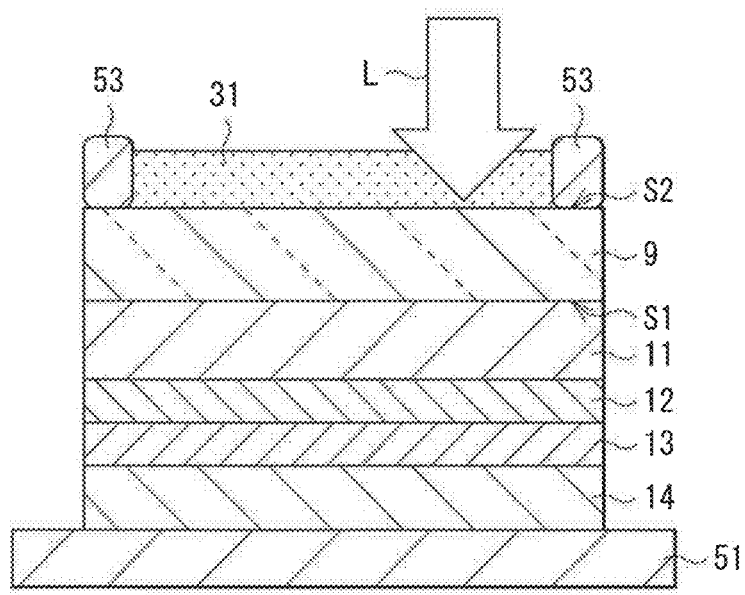
FIG. 26B is a schematic cross-sectional view of the manufacturing step illustrated in FIG. 26A.

FIGS. 26A and 26B each illustrate one process of a method of manufacturing a display unit 1 according to Modification Example 1. More specifically, FIG. 26A is a perspective view of a support substrate 9 used for this process, and FIG. 26B is a cross-sectional view of the display unit 1. In the process by which the back surface S2 of the support substrate 9 is brought into contact with the liquid 31, a dam 53 may be used instead of the above-described container 52.

After a protection layer 14 is formed as with the process described in the first embodiment, the dam 53 may be formed on the periphery of the back surface S2 of the support substrate 9. The dam 53 may have a planar shape substantially the same as the outline of the support substrate 9, namely, may be a rectangular frame. The dam 53 may be made of a material used for dams, such as a resin. Example of the resin may include a silicone resin and an epoxy resin. Thereafter, the liquid 31 may be stored inside the dam 53. The liquid 31 thereby may be brought into contact with the back surface S2 of the support substrate 9. Subsequently, irradiation with the laser light L may be performed from the back surface S2 of the support substrate 9, with the back surface S2 of the support substrate 9 being in contact with the liquid 31. Thereafter, the liquid 31 and the dam 53 may be removed, and then the support substrate 9 may be detached from the flexible substrate 11.

5. Modification Example 2

Figure 27A:
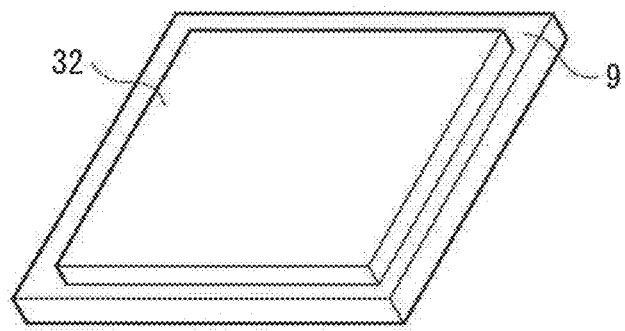
FIG. 27A is an explanatory perspective view of a method of manufacturing a display unit, according to Modification Example 2.
Figure 27B:
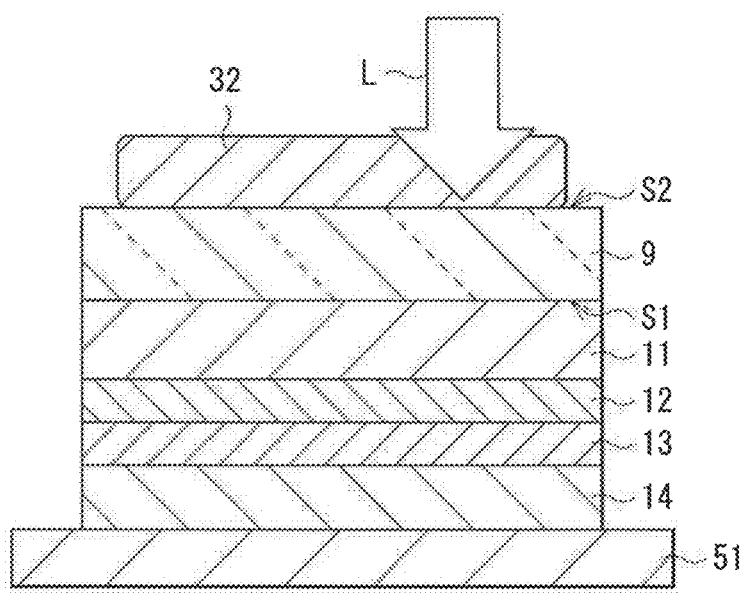
FIG. 27B is a schematic cross-sectional view of the manufacturing step illustrated in FIG. 27A.

FIGS. 27A and 27B each illustrate one process of a method of manufacturing a display unit 1 according to Modification Example 2. More specifically, FIG. 27A is a perspective view of a support substrate 9 used for this process, and FIG. 27B is a cross-sectional view of the display unit 1. In the process by which the back surface S2 of the support substrate 9 is brought into contact with the liquid 31, a high-viscosity material 32 as a flowable member may be used instead of the liquid 31. The high-viscosity material 32 may be a resin, such as an acrylic resin or an epoxy resin. As with the liquid 31, the refractive index of the high-viscosity material 32 may be preferably equal to or substantially equal to that of the constituent material for the support substrate 9.

After a protection layer 14 is formed with the process described in the first embodiment, the back surface S2 of the support substrate 9 may be coated with the high-viscosity material 32. The high-viscosity material 32 thereby may be brought into contact with the back surface S2 of the support substrate 9. Subsequently, irradiation with the laser light L may be performed from the back surface S2 of the support substrate 9, with the back surface S2 of the support substrate 9 being in contact with the high-viscosity material 32. Thereafter, the high-viscosity material 32 may be removed, and then the support substrate 9 may be detached from the flexible substrate 11.

6. Modification Example 3

A photo-curable high-viscosity material 32, such as an ultraviolet curable material, may be used. Alternatively, a thermosetting high-viscosity material 32 may be used. When the high-viscosity material 32 of any of these types is used, the high-viscosity material 32 may be cured on and fixed to the support substrate 9, and then the back surface S2 of the support substrate 9 may be irradiated with the laser light L. The photo-curable or thermosetting high-viscosity material 32 may be a resin such as an acrylic resin and an epoxy resin.

First, in the same manner as the foregoing Modification Example 2, the back surface S2 of the support substrate 9 may be coated with the high-viscosity material 32. Subsequently, the high-viscosity material 32 may be optically or thermally cured, and then irradiation with the laser light L may be performed from the back surface S2 of the support substrate 9.

7. Third Embodiment

Figure 28A:
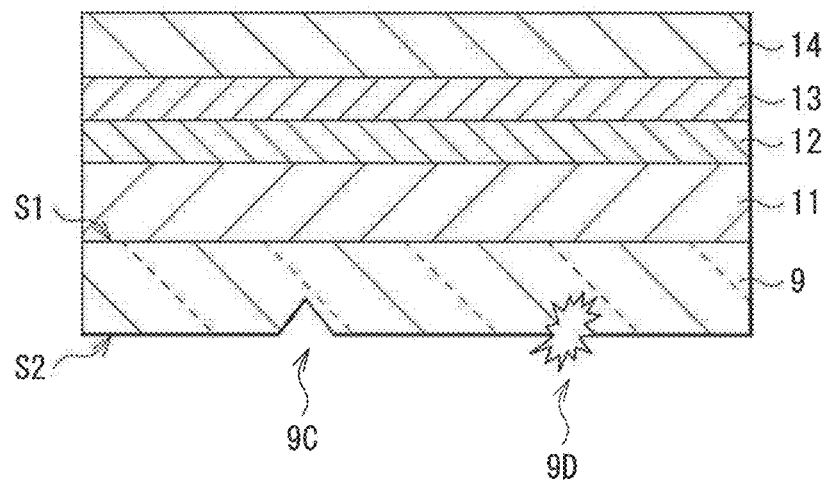
FIG. 28A is an explanatory schematic cross-sectional view of a method of manufacturing a display unit, according to a third embodiment.
Figure 28B:
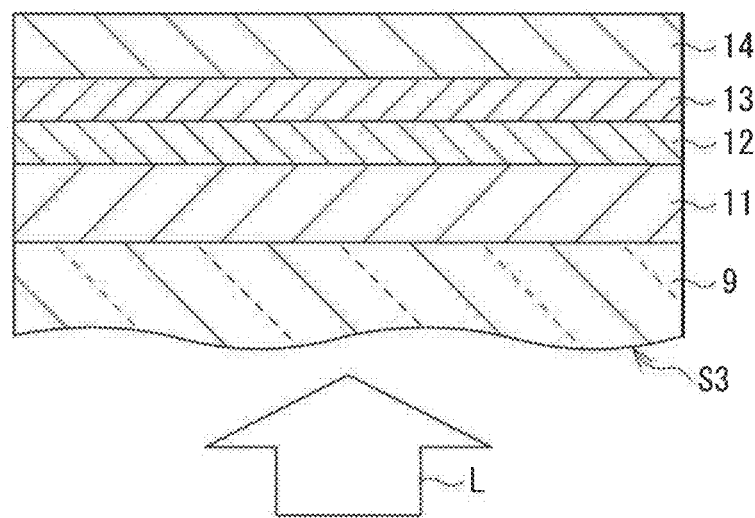
FIG. 28B is a schematic cross-sectional view of a step subsequent to the step illustrated in FIG. 28A.

A description is given of a method of manufacturing a display unit 1 according to a third embodiment of the disclosure, with reference to FIGS. 28A and 28B. In the method of manufacturing the display unit 1 according to the third embodiment, a back surface S2 of a support substrate 9 may be subjected to a surface treatment, instead of being brought into contact with a liquid, i.e., the liquid 31 in FIG. 15. With this surface treatment, a treated surface S3 that is uniform may be formed, as illustrated in FIG. 28B. The method of manufacturing the display unit 1 according to the third embodiment is different from the foregoing method of manufacturing the display unit 1 according to the second embodiment in this technical point.

First, a protection layer 14 may be formed as with the foregoing method according to the first embodiment. Thereafter, the back surface S2 of the support substrate 9 may be subjected to the surface treatment. Examples of this surface treatment may include an etching treatment using an abrasive and a dissolution treatment. The etching treatment using an abrasive may be a wet blasting method, for example, and the abrasive may be made of aluminum-oxide particles, for example. The dissolution treatment may be a wet etching treatment, for example, and may involve using a solution, such as fluoric acid. With this surface treatment, the whole of the back surface S2 of the support substrate 9 may be polished, so that the back surface S2 is formed into the treated surface S3, as illustrated in FIG. 28B. Simultaneously with the polishing of the back surface S2, a flaw 9C and a foreign object 9D, illustrated in FIG. 28A, that have been present on the back surface S2 of the support substrate 9 may be removed. Thus, the treated surface S3 may have uniform roughness. After the treated surface S3 is formed, irradiation with laser light L may be performed from the treated surface S3, i.e., the back surface S2, so that the support_substrate 9 is detached from the flexible substrate 11. In this case, the roughness of the treated surface S3 may be determined in consideration of the sizes of the flaw 9C and the foreign object 9D and the propagation efficiency of the laser light L1. For example, as the roughness of the treated surface S3 becomes greater, the propagation efficiency of the laser light L may become lower; however, a deeper flaw 9C may be able to be removed. The roughness of the treated surface S3 may vary depending on the type of an abrasive or a solution, for example.

In this embodiment, the back surface S2 of the support substrate 9 may be subjected to the surface treatment. With this surface treatment, the flaw 9C, the foreign object 9D, and other faults that have been present on the back surface S2 of the support substrate 9 may be removed, so that the treated surface S3 having regular roughness is formed. Thereafter, the uniform treated surface S3 may be irradiated evenly with the laser light L. As a result, the energy of the laser light L is transmitted evenly to the interface between the support substrate 9 and the flexible substrate 11. Thus, it becomes possible to lessen influences of the flaw 9C, the foreign object 9D, and other faults over the irradiation with the laser light L, even when they are present on the back surface S2 of the support substrate 9. Consequently, it is possible to suppress occurrence of disadvantage at the manufacturing step of detaching the support substrate 9 from the flexible substrate 11, thereby manufacturing the display unit 1 at an improved yield rate.

Even when the flaw 9C, the foreign object 9D, and other faults are not removed completely, the treated surface S3 may facilitate the scattering of the laser light L, because the treated surface S3 is rougher than the back surface S2 before being subjected to the surface treatment. This allows the laser light L to reach the whole of the interface between the support substrate 9 and the flexible substrate 11, regardless of whether the flaw 9C, the foreign object 9D, and other faults are present.

8. Application Example 2

Next, a description is given of Application Example 2 in which the flexible device, such as the display unit 1, according to any of the first to third embodiments, Modification Examples 1 to 3, and Application Example 1 is applied to an electronic apparatus.

A description is given of examples of block configurations of a display unit and an imaging unit, which are specific examples of the flexible device of the disclosure.

[Example of Block Configuration of Display Unit 1]

Figure 29:
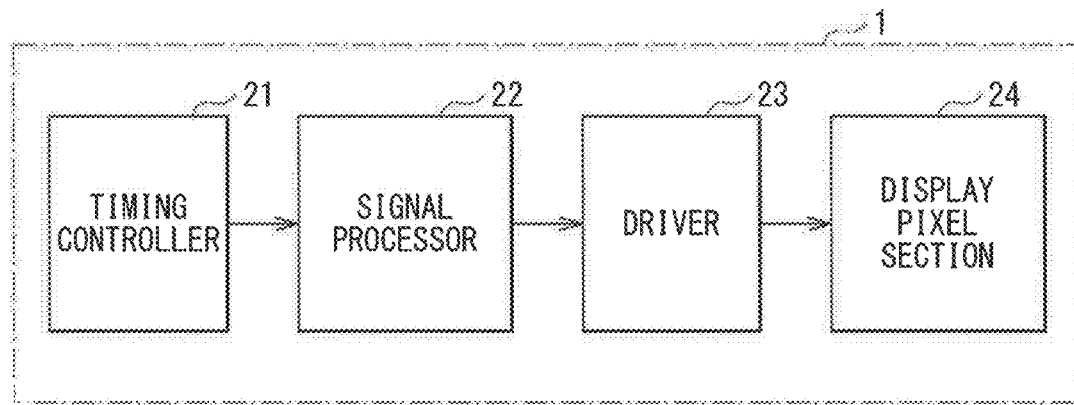
FIG. 29 is a block diagram illustrating an example of an overall configuration of a display unit as a flexible device.

FIG. 29 schematically illustrates, in a block diagram, an example of an overall configuration of a display unit 1 as the flexible device. The display unit 1 may display an image signal outputted from the outside or generated inside, as an image. The display unit 1 is applicable not only to an organic EL display as described above but also to a liquid crystal display, for example. The display unit 1 may include a timing controller 21, a signal processor 22, a driver 23, and a display pixel section 24, for example.

The timing controller 21 may have a timing generator that generates various timing signals, which are also referred to as control signals. The timing controller 21 may control the driving of the signal processor 22, for example, on the basis of the various timing signals.

The signal processor 22 may subject a digital image signal inputted from the outside to a predetermined correction, for example, and may output a resultant image signal to the driver 23.

The driver 23 may include a scanning line drive circuit and a signal line drive circuit, for example, and may drive each pixel of the display pixel section 24 through various control lines.

The display pixel section 24 may include: a display element, such as an organic EL element or a liquid crystal element, which correspond to the display element layer 13 described above; and a pixel circuit that drives the display element on a pixel basis. The semiconductor unit 10 including the TFT layer 12 described above is used for various circuits, for example, that constitute a part of the driver 23 or the display pixel section 24 among the above constituent elements.

[Example of Block Configuration of Imaging Unit 2]

In the first to third embodiments, Modification Examples 1 to 3, and Application Examples 1 and 2, the display unit 1 has been described as a specific example of the flexible device of the disclosure or as an application example of the semiconductor unit 10. However, the flexible device of the disclosure may be implemented using not only the display unit 1 but also other devices, such as an imaging unit. In other words, the semiconductor unit 10 may be applied not only to the display unit 1 but also to an imaging unit.

Figure 30:
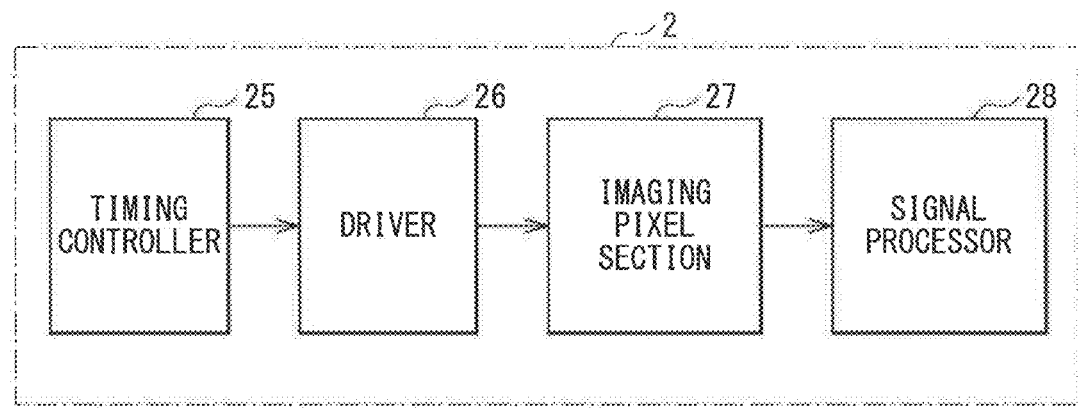
FIG. 30 is a block diagram illustrating an example of an overall configuration of an imaging unit as a flexible device.

FIG. 30 schematically illustrates, in a block diagram, an example of an overall configuration of an imaging unit 2 as the flexible device. The imaging unit 2 may be, for example a solid state imaging unit that acquires an image in the form of an electric signal. The imaging unit 2 may be configured by a charge coupled device (CCD) or complementary metal oxide semiconductor (CMOS) image sensor, for example. The imaging unit 2 may include a timing controller 25, a driver 26, an imaging pixel section 27, and a signal processor 28, for example.

The timing controller 25 may have a timing generator that generates various timing signals, which are also referred to as control signals. The timing controller 21 may control the driving of the driver 26 on the basis of the various timing signals.

The driver 26 may include a row selection circuit, an analog-to-digital (AD) conversion circuit, and a horizontal transfer scanning circuit, for example. The driver 26 may drive the imaging pixel section 27 so as to read signals from each pixel therein through various control lines.

The imaging pixel section 27 may include: imaging elements or photoelectric conversion elements, such as photodiodes; and a pixel circuit that reads signals, for example. Examples of such an imaging element may include an element that detects visible light and an element that directly or indirectly detects any of infrared light, ultraviolet light, and radioactive rays such as X rays.

The signal processor 28 may subject a signal received from the imaging pixel section 27 to various signal processes. The semiconductor unit 10 including the TFT layer 12 described above is used for various circuits, for example, that constitute a part of the driver 26 or the display pixel section 27 among the above constituent elements.

[Example of Configuration of Electronic Apparatus]

The flexible devices described in the first to third embodiments, Modification Examples 1 to 3, and Application Examples 1 and 2, which include the display unit 1 and the imaging unit 2 provided with the semiconductor unit 10, are applicable to various types of electronic apparatuses.

Figure 31:
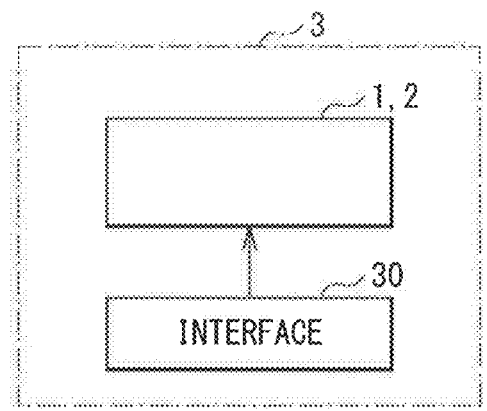
FIG. 31 is a block diagram illustrating Application Example 2 in which an electronic apparatus includes any of the display unit illustrating in FIG. 29 and the imaging unit illustrated in FIG. 30.

FIG. 31 illustrates, in a block diagram, Application Example 2 in which an electronic apparatus includes the display unit 1 illustrated in FIG. 29 or the imaging unit 2 illustrated in FIG. 30. This electronic apparatus is referred to below as an electronic apparatus 3. Examples of the electronic apparatus 3 may include a television, a personal computer (PC), a smartphone, a tablet PC, a portable phone, a digital still camera, and a digital video camera.

The electronic apparatus 3 may include the display unit 1 or the imaging unit 2 described above and an interface 30, for example. The interface 30 may be an input section that receives various signals and is supplied with electricity from the outside. The interface 30 may include a user interface, such as a touch panel, a keyboard, or operation buttons.

Hereinabove, the technology of the disclosure has been described using the first to third embodiments and Application Examples 1 and 2. However, the technology is not limited to the first to third embodiments, Modification Examples 1 to 3, and Application Examples 1 and 2, and may be modified in various ways.

For example, factors such as a material and a thickness of each layer exemplified in the foregoing first to third embodiments, Modification Examples 1 to 3, and Application Examples 1 and 2 are illustrative and non-limiting. Any other material, any other thickness, and any other factor may be adopted besides those described above. It is not essential for the semiconductor unit to include all of the layers described above. Alternatively, the foregoing semiconductor unit may further include any other layer in addition to the layers described above.

A technique of the multidirectional oblique irradiation with laser light is not limited to the technique described in the foregoing first to third embodiments, Modification Examples 1 to 3, and Application Examples 1 and 2. Any other techniques may be employed to achieve the multidirectional oblique irradiation.

As a specific example, oblique irradiation with laser light in three or more directions may be performed.

A description has been given, in the foregoing second embodiment, of the case where the support substrate is irradiated with laser light while being mounted in a container. However, the support substrate may be temporarily mounted in the container and then taken out of the container, following which the support substrate may be irradiated with laser light.

A description has been given, in the foregoing second embodiment and Modification Examples 1 to 3, of the case where each of the liquid and the high-viscosity material is used as a flowable member. However, for example, other forms of substance such as a gel substance may also be used as a flowable member.

Various examples described heretofore may be combined as appropriate for application. For example, the back surface of the support substrate may be subjected to a surface treatment, then brought into contact with a flowable member, and irradiated with laser light.

It is to be noted that the effects described herein are mere examples and are not limited thereto, and may include other effects.

Moreover, the technology may also have the following configurations.

(1)

A method of manufacturing a flexible device, including:

joining a first surface of a support substrate to a back surface of a flexible substrate, the first surface being opposite to a second surface of the support substrate;

forming an element layer on a front surface of the flexible substrate; and performing multidirectional oblique irradiation of an interface and its vicinity between the support substrate and the flexible substrate with laser light from the second surface of the support substrate to detach the support substrate from the flexible substrate.

(2)

The method of manufacturing the flexible device according to (1), wherein the multidirectional oblique irradiation of the interface and its vicinity is performed at single irradiation with the laser light.

(3)

The method of manufacturing the flexible device according to (2), wherein the multidirectional oblique irradiation performed at single irradiation with the laser light includes causing a beam splitter to split an optical path of the laser light emitted from a laser light source into a plurality of optical paths.

(4)

The method of manufacturing the flexible device according to (1), wherein the multidirectional oblique irradiation of the interface and its vicinity is performed at multiple irradiation with the laser light.

(5)

The method of manufacturing the flexible device according to (4), wherein an irradiation angle of the laser light with which the oblique irradiation is performed is fixed, and the multidirectional oblique irradiation performed at the multiple irradiation with the laser light includes:

performing the oblique irradiation;

rotating the support substrate in an in-plane direction after the performing of the oblique irradiation; and performing the oblique irradiation again after the rotating of the support substrate.

(6)

The method of manufacturing the flexible device according to any one of (1) to (5), wherein the multidirectional oblique irradiation of the interface and its vicinity is performed using one or more of laser light sources.

(7)

The method of manufacturing the flexible device according to any one of (1) to (6), wherein the multidirectional oblique irradiation with the laser light is performed by sequentially moving a linear region irradiated with the laser light in a direction within a plane near the interface.

(8)

The method of manufacturing the flexible device according to any one of (1) to (7), wherein an irradiation angle of the laser light at which the oblique irradiation is performed is adjustable.

(9)

A method of manufacturing a flexible device, including:

joining a back surface of a flexible substrate to a first surface of a support substrate;

forming an element layer on a front surface of the flexible substrate;

bringing a second surface of the support substrate into contact with a flowable member, the second surface being opposite to the first surface; and performing irradiation with laser light from the second surface of the support substrate to detach the support substrate from the flexible substrate.

(10)

The method of manufacturing the flexible device according to (9), wherein the second surface of the support substrate is provided with a recess, and the irradiation with the laser light is performed after filling of the recess with the flowable member.

(11)

The method of manufacturing the flexible device according to (9) or (10), wherein the flowable member has a refractive index that is greater than a refractive index of air but is equal to or smaller than a refractive index of a constituent material for the support substrate.

(12)

The method of manufacturing the flexible device according to any one of (9) to (11), wherein the flowable member has a refractive index that is equal to or substantially equal to a refractive index of a constituent material for the support substrate.

(13)

The method of manufacturing the flexible device according to any one of (9) to (12), wherein the irradiation with the laser light is performed from the second surface of the support substrate, with the second surface of the support substrate being in contact with the flowable member.

(14)

A method of manufacturing a flexible device, including:

joining a back surface of a flexible substrate to a first surface of a support substrate;

forming an element layer on a front surface of the flexible substrate;

subjecting a second surface of the support substrate to a surface treatment, the second surface being opposite to the first surface; and performing irradiation with laser light from the second surface of the support substrate to detach the support substrate from the flexible substrate.

(15) The method of manufacturing the flexible device according to (14), wherein the subjecting of the second surface of the support substrate to the surface treatment forms the second surface of the support substrate into a uniform treated surface.

(16) The method of manufacturing the flexible device according to (15), wherein the treated surface of the support substrate has uniform roughness.

(17) The method of manufacturing the flexible device according to any one of (14) to (16), wherein the surface treatment includes performing an etching treatment using an abrasive.

(18) The method of manufacturing the flexible device according to any one of (14) to (16), wherein the surface treatment includes performing a dissolution treatment.

(19) An apparatus for manufacturing a flexible device, including:

an element forming section that forms an element layer on a front surface of a flexible substrate, the flexible substrate having a back surface that is joined to a first surface of a support substrate, the first surface being opposite to a second surface of the support substrate; and one or more of a plurality of laser light sources that irradiate an interface and its vicinity between the support substrate and the flexible substrate with laser light from the second surface of the support substrate), wherein multidirectional oblique irradiation of the interface and its vicinity with the laser light causes the support substrate to be detached from the flexible substrate.

(20) The apparatus for manufacturing the flexible device according to (19), wherein the one or more of the plurality of laser light sources include a laser light source, and the apparatus further includes:

a beam splitter that splits an optical path of the laser light emitted from the laser light source into a plurality of optical paths; and a mirror that performs the multidirectional oblique irradiation by reflecting laser light emitted from the beam splitter and traveling along each of the plurality of optical paths.

In the method of manufacturing the flexible device according to the first embodiment of the disclosure or the apparatus for manufacturing the flexible device according to the embodiment of the disclosure, the interface and its vicinity between the support substrate and the flexible substrate is irradiated obliquely with the laser light in the multi-directions, so that the support substrate is detached from the flexible substrate. Consequently, even when any foreign object or flaw is present on the support substrate, for example, it is possible to reduce or eliminate the risk of formation of a region unirradiated with the laser light which is attributed to the foreign object or flaw.

In the method of manufacturing the flexible device according to the second embodiment of the disclosure, the support substrate is irradiated with the laser light, with the second surface being in contact with the flowable member. This makes it possible to lessen influences of the flaw or recess over the irradiation of the laser light even when any flaw or recess is present on the second surface of the support substance, because the flowable member flows into the flaw or recess. In this case, for example, a refractive index of the flowable member may be set to be equal to or substantially equal to a refractive index of a constituent material for the support substrate. This makes it possible to cause the laser light incident on the flaw and other regions to travel inside the support substrate in similar manners.

In the method of manufacturing the flexible device according to the third embodiment of the disclosure, the support substrate with the second surface subjected to the surface treatment is irradiated with the laser light. This allows the second surface to be formed into a uniformly treated surface, even when any flaw, foreign object, or other faults are present on the second surface of the support substrate, for example. Thus, the flaw, foreign object, or other faults are removed upon the irradiation with the laser light. This facilitates the scattering of the laser light inside the support substrate when the support substrate is irradiated. Consequently, it is possible to lessen influences of any flaw, foreign object, or other faults over the irradiation of the laser light. In this case, the surface treatment may be an etching treatment using an abrasive or a dissolution treatment, for example.

In any of the method of manufacturing the flexible device according to the first embodiment of the disclosure and the apparatus for manufacturing the flexible device according to the embodiment of the disclosure, the interface and its vicinity between the support substrate and the flexible substrate is irradiated obliquely with the laser light in the multi-directions, so that the support substrate is detached from the flexible substrate. This makes it possible to reduce or eliminate the risk of formation of a region unirradiated with the laser light which is attributed to a foreign object or a flaw on the support substrate. Consequently, it is possible to manufacture a flexible device at an improved yield rate.

In the method of manufacturing the flexible device according to the second embodiment of the disclosure, the second surface of the support substrate is brought into contact with the flowable member. In the method of manufacturing the flexible device according to the third embodiment of the disclosure, the second surface of the support substrate is subjected to the surface treatment. This makes it possible to lessen influences of any flaw, foreign object, or other faults over the irradiation of the laser light. Consequently, it is possible to reduce occurrence of disadvantages at the manufacturing step of detaching the support substrate from the flexible substrate, thereby manufacturing a flexible device at an improved yield rate.

It should be noted that the effects described above are not necessarily limitative, and the technology may achieve any other effects described herein.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a flexible device, comprising:

joining a first surface of a support substrate to a back surface of a flexible substrate, the first surface being opposite to a second surface of the support substrate;

forming an element layer on a front surface of the flexible substrate; and performing multidirectional oblique irradiation of an interface and its vicinity between the support substrate and the flexible substrate with laser light from the second surface of the support substrate to detach the support substrate from the flexible substrate, wherein the multidirectional oblique irradiation comprises:
performing the oblique irradiation;
rotating the support substrate about an axis parallel to a plane of the back surface of the flexible substrate; and
performing the oblique irradiation again after the rotating of the support substrate.

2. The method of manufacturing the flexible device according to claim 1, wherein the multidirectional oblique irradiation of the interface and its vicinity is performed at single irradiation with the laser light.

3. The method of manufacturing the flexible device according to claim 2, wherein the multidirectional oblique irradiation performed at single irradiation with the laser light comprises causing a beam splitter to split an optical path of the laser light emitted from a laser light source into a plurality of optical paths.

4. The method of manufacturing the flexible device according to claim 1, wherein the multidirectional oblique irradiation of the interface and its vicinity is performed at multiple irradiation with the laser light.

5. The method of manufacturing the flexible device according to claim 4, wherein
an irradiation angle of the laser light with which the oblique irradiation is performed is fixed.

6. The method of manufacturing the flexible device according to claim 1, wherein the multidirectional oblique irradiation of the interface and its vicinity is performed using one or more of laser light sources.

7. The method of manufacturing the flexible device according to claim 1, wherein the multidirectional oblique irradiation with the laser light is performed by sequentially moving a linear region irradiated with the laser light in a direction within a plane near the interface.

8. The method of manufacturing the flexible device according to claim 1, wherein an irradiation angle of the laser light at which the oblique irradiation is performed is adjustable.

9. A method of manufacturing a flexible device, comprising:
joining a back surface of a flexible substrate to a first surface of a support substrate;
forming an element layer on a front surface of the flexible substrate;
bringing a second surface of the support substrate into contact with a flowable member, the second surface being opposite to the first surface; and
performing irradiation with laser light from the second surface of the support substrate to detach the support substrate from the flexible substrate.

10. The method of manufacturing the flexible device according to claim 9, wherein
the second surface of the support substrate is provided with a recess, and
the irradiation with the laser light is performed after filling of the recess with the flowable member.

11. The method of manufacturing the flexible device according to claim 10, wherein the flowable member has a refractive index that is greater than a refractive index of air but is equal to or smaller than a refractive index of a constituent material for the support substrate.

12. The method of manufacturing the flexible device according to claim 9, wherein the flowable member has a refractive index that is equal to or substantially equal to a refractive index of a constituent material for the support substrate.

13. The method of manufacturing the flexible device according to claim 9, wherein the irradiation with the laser light is performed from the second surface of the support substrate, with the second surface of the support substrate being in contact with the flowable member.

14. A method of manufacturing a flexible device, comprising:
joining a back surface of a flexible substrate to a first surface of a support substrate;
forming an element layer on a front surface of the flexible substrate;
subjecting a second surface of the support substrate to a surface treatment, the second surface being opposite to the first surface, wherein the surface treatment comprises performing an etching treatment using an abrasive; and
performing irradiation with laser light, after the surface treatment, from the second surface of the support substrate to detach the support substrate from the flexible substrate.

15. The method of manufacturing the flexible device according to claim 14, wherein the subjecting of the second surface of the support substrate to the surface treatment forms the second surface of the support substrate into a uniform treated surface.

16. The method of manufacturing the flexible device according to claim 15, wherein the treated surface of the support substrate has uniform roughness.

* * * * *